US010290648B1

United States Patent
Zhou et al.

(10) Patent No.: US 10,290,648 B1
(45) Date of Patent: May 14, 2019

(54) THREE-DIMENSIONAL MEMORY DEVICE CONTAINING AIR GAP RAILS AND METHOD OF MAKING THEREOF

(71) Applicant: SANDISK TECHNOLOGIES LLC, Plano, TX (US)

(72) Inventors: Fei Zhou, San Jose, CA (US); Raghuveer S. Makala, Campbell, CA (US); Rahul Sharangpani, Fremont, CA (US); Adarsh Rajashekhar, Santa Clara, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/834,261

(22) Filed: Dec. 7, 2017

(51) Int. Cl.
*H01L 29/08* (2006.01)
*H01L 21/311* (2006.01)
(Continued)

(52) U.S. Cl.
CPC ... *H01L 27/11582* (2013.01); *H01L 21/31111* (2013.01); *H01L 21/7682* (2013.01); *H01L 21/76802* (2013.01); *H01L 21/76877* (2013.01); *H01L 23/528* (2013.01); *H01L 23/5226* (2013.01); *H01L 23/5329* (2013.01); *H01L 27/11521* (2013.01); *H01L 27/11526* (2013.01); *H01L 27/11556* (2013.01); *H01L 27/11568* (2013.01); *H01L 27/11573* (2013.01); *H01L 29/0847* (2013.01); *H01L 27/11519* (2013.01); *H01L 27/11565* (2013.01)

(58) Field of Classification Search
None
See application file for complete search history.

(56) References Cited

U.S. PATENT DOCUMENTS 5,915,167 A   6/1999  Leedy
8,658,499 B2  2/2014  Makala et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Telly D Green
(74) *Attorney, Agent, or Firm* — The Marbury Law Group PLLC

(57) ABSTRACT

An alternating stack of insulating layers and spacer material layers located over a substrate. The spacer material layers are formed as, or are subsequently replaced with, electrically conductive layers. Memory stack structures are formed through the alternating stack. After formation of a backside trench, electrically-conductive-layer-level recessed cavities are formed by laterally recessing the electrically conductive layers around the backside trench. Electrically conductive rails are formed on remaining portions of the electrically conductive layers by selective deposition of a conductive material. Insulating-layer-level recessed cavities are formed by laterally recessing the insulating layers around the backside trench. A continuous insulating material layer can be formed in the insulating-layer-level recessed cavities with air gap rails cavities to reduce capacitive coupling among the electrically conducive rails.

12 Claims, 29 Drawing Sheets

(51) Int. Cl.
*H01L 21/768* (2006.01)
*H01L 23/522* (2006.01)
*H01L 23/528* (2006.01)
*H01L 23/532* (2006.01)
*H01L 27/11519* (2017.01)
*H01L 27/11521* (2017.01)
*H01L 27/11526* (2017.01)
*H01L 27/11556* (2017.01)
*H01L 27/11565* (2017.01)
*H01L 27/11568* (2017.01)
*H01L 27/11573* (2017.01)
*H01L 27/11582* (2017.01)

(56) References Cited

U.S. PATENT DOCUMENTS

| | | | |
|---|---|---|---|
| 8,847,302 | B2 | 9/2014 | Alsmeier et al. |
| 9,356,031 | B2 | 5/2016 | Lee et al. |
| 9,419,012 | B1 | 8/2016 | Shimabukuro et al. |
| 9,449,982 | B2 | 9/2016 | Lu et al. |
| 9,449,984 | B2 | 9/2016 | Alsmeier et al. |
| 9,576,975 | B2 | 2/2017 | Zhang et al. |
| 9,646,989 | B1* | 5/2017 | Yoshimizu ........ H01L 27/11578 |
| 9,691,884 | B2 | 6/2017 | Makala et al. |
| 9,768,270 | B2 | 9/2017 | Gunji-Yoneoka et al. |
| 9,806,089 | B2 | 10/2017 | Sharangpani et al. |
| 9,984,963 | B2* | 5/2018 | Peri ................... H01L 23/5226 |
| 10,050,054 | B2* | 8/2018 | Zhang .............. H01L 27/11582 |
| 10,115,459 | B1* | 10/2018 | Yamada ............. G11C 13/0002 |
| 10,128,261 | B2* | 11/2018 | Makala ............ H01L 27/11578 |
| 2015/0179662 | A1* | 6/2015 | Makala ............ H01L 27/11578 257/314 |
| 2015/0380419 | A1 | 12/2015 | Gunji-Yoneoka et al. |
| 2016/0351497 | A1* | 12/2016 | Peri .................... H01L 23/5226 |
| 2017/0207236 | A1* | 7/2017 | Kitamura .......... H01L 27/11582 |
| 2017/0243879 | A1 | 8/2017 | Yu et al. |
| 2017/0287925 | A9* | 10/2017 | Makala ............ H01L 27/11578 |
| 2017/0352669 | A1* | 12/2017 | Sharangpani ........ H01L 27/1157 |
| 2018/0019256 | A1* | 1/2018 | Amano ............ H01L 27/11582 |
| 2018/0033646 | A1* | 2/2018 | Sharangpani ....... H01L 27/1157 |
| 2018/0090373 | A1* | 3/2018 | Sharangpani ..... H01L 21/76846 |
| 2018/0097009 | A1* | 4/2018 | Zhang ............ H01L 27/11582 |
| 2019/0006383 | A1* | 1/2019 | Matsuno .......... H01L 27/11582 |

OTHER PUBLICATIONS

U.S. Appl. No. 15/332,429, filed Oct. 24, 2016, SanDisk Technologies LLC.
U.S. Appl. No. 15/413,034, filed Jan. 23, 2017, SanDisk Technologies LLC.
U.S. Appl. No. 15/624,006, filed Jun. 15, 2017, SanDisk Technologies LLC.
U.S. Appl. No. 15/730,045, filed Oct. 11, 2017, SanDisk Technologies LLC.
U.S. Appl. No. 15/813,579, filed Nov. 15, 2017, SanDisk Technologies LLC.
U.S. Appl. No. 15/813,625, filed Nov. 15, 2017, SanDisk Technologies LLC.
U.S. Appl. No. 15/830,838, filed Dec. 4, 2017, SanDisk Technologies LLC.

* cited by examiner

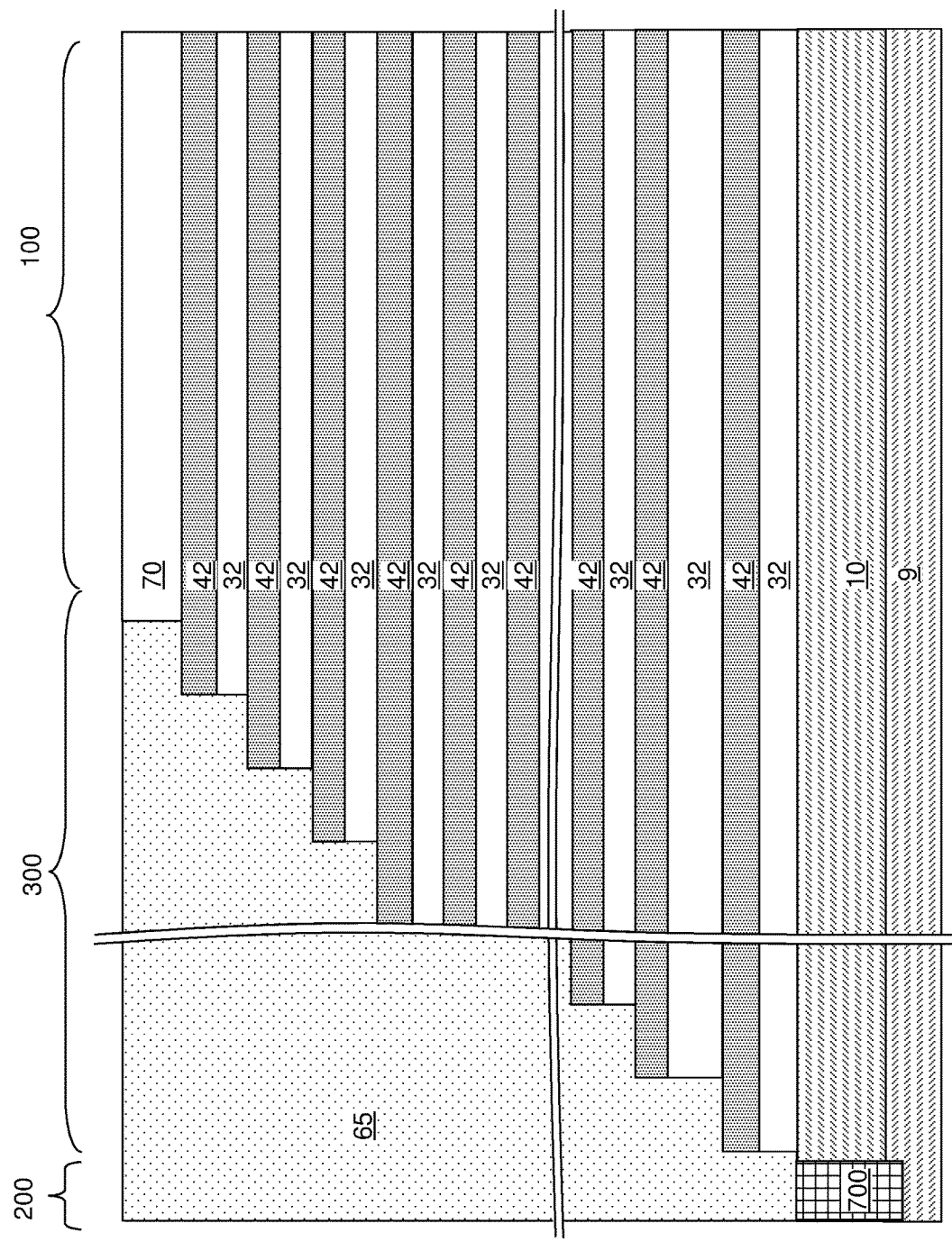

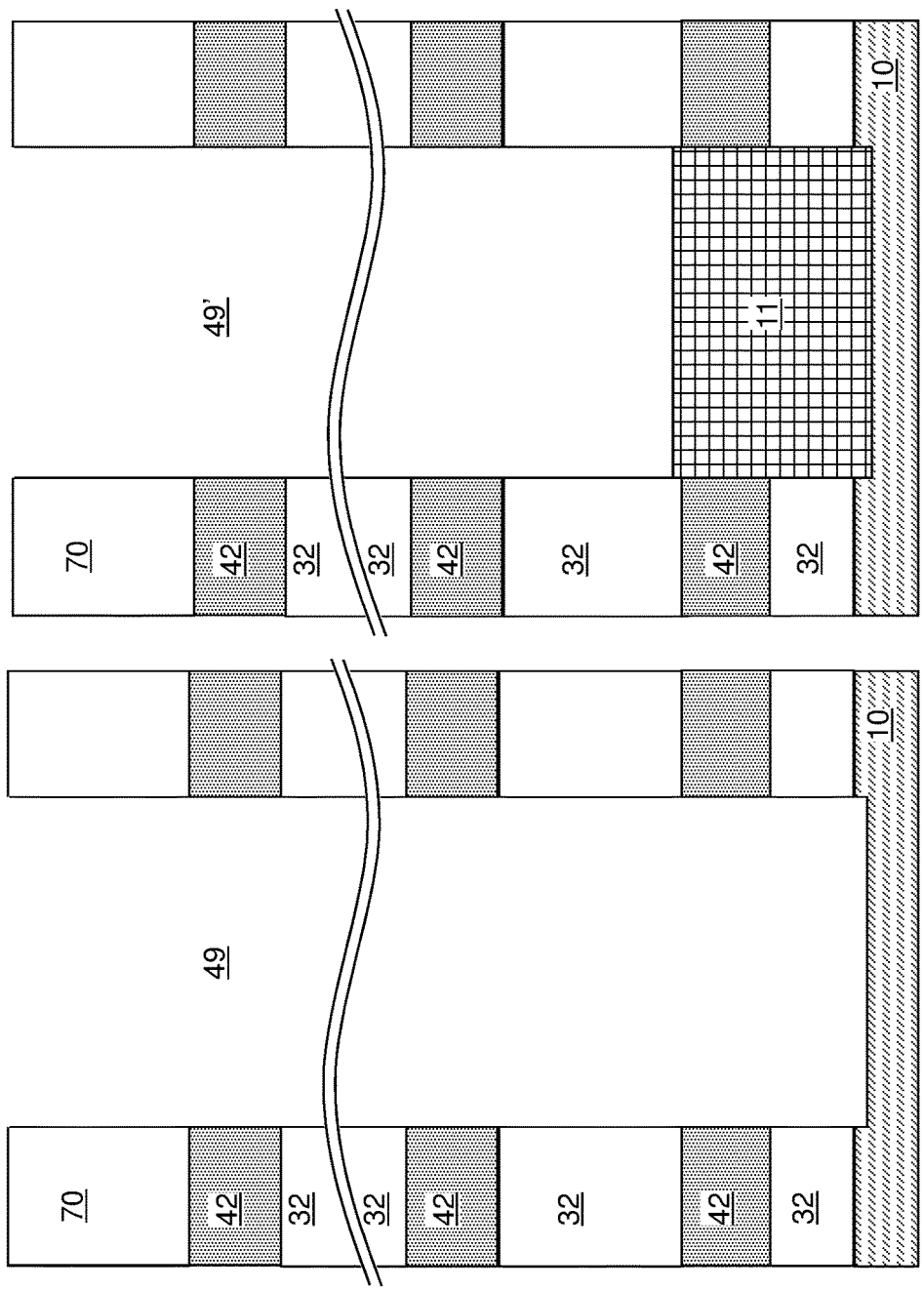

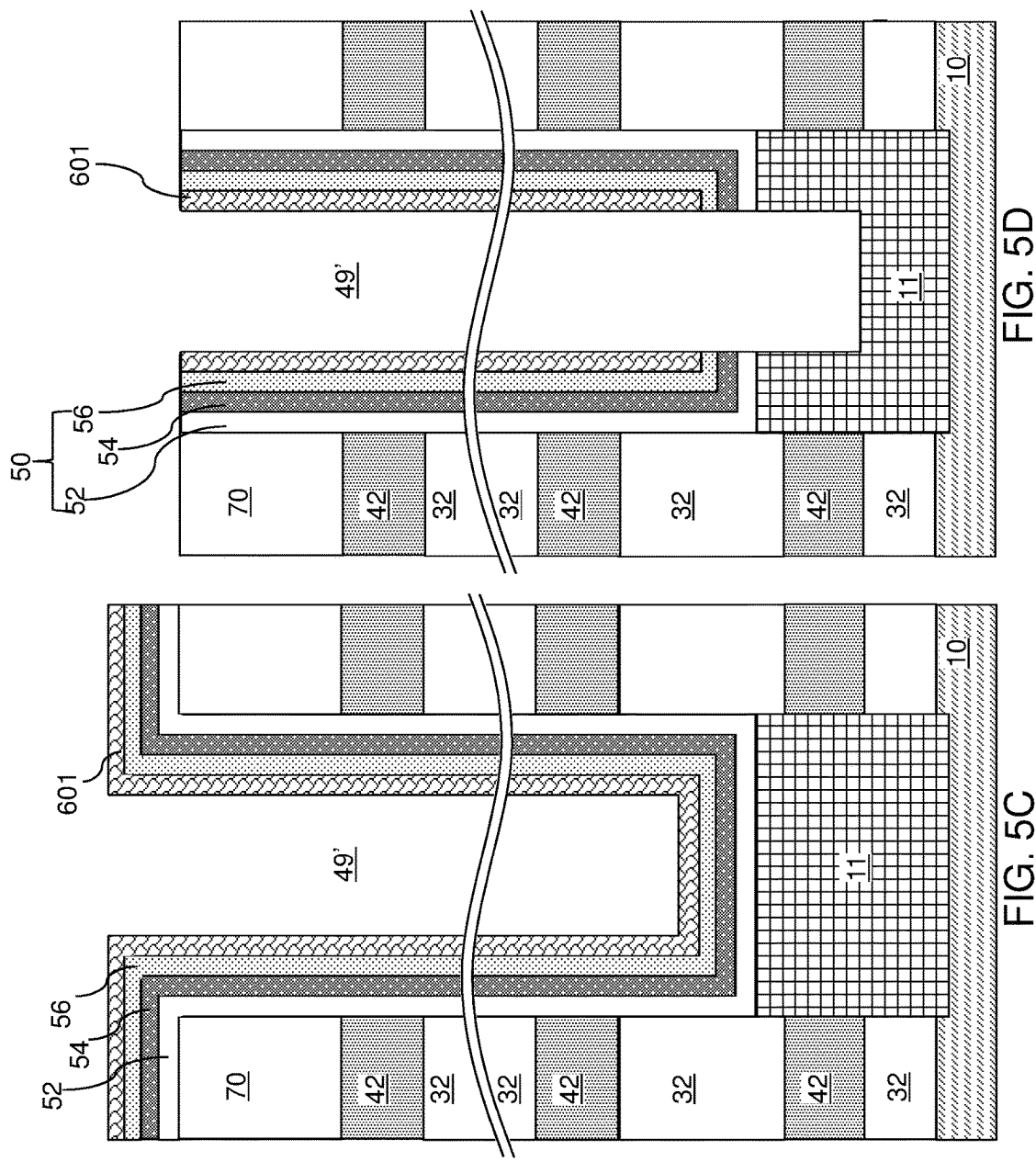

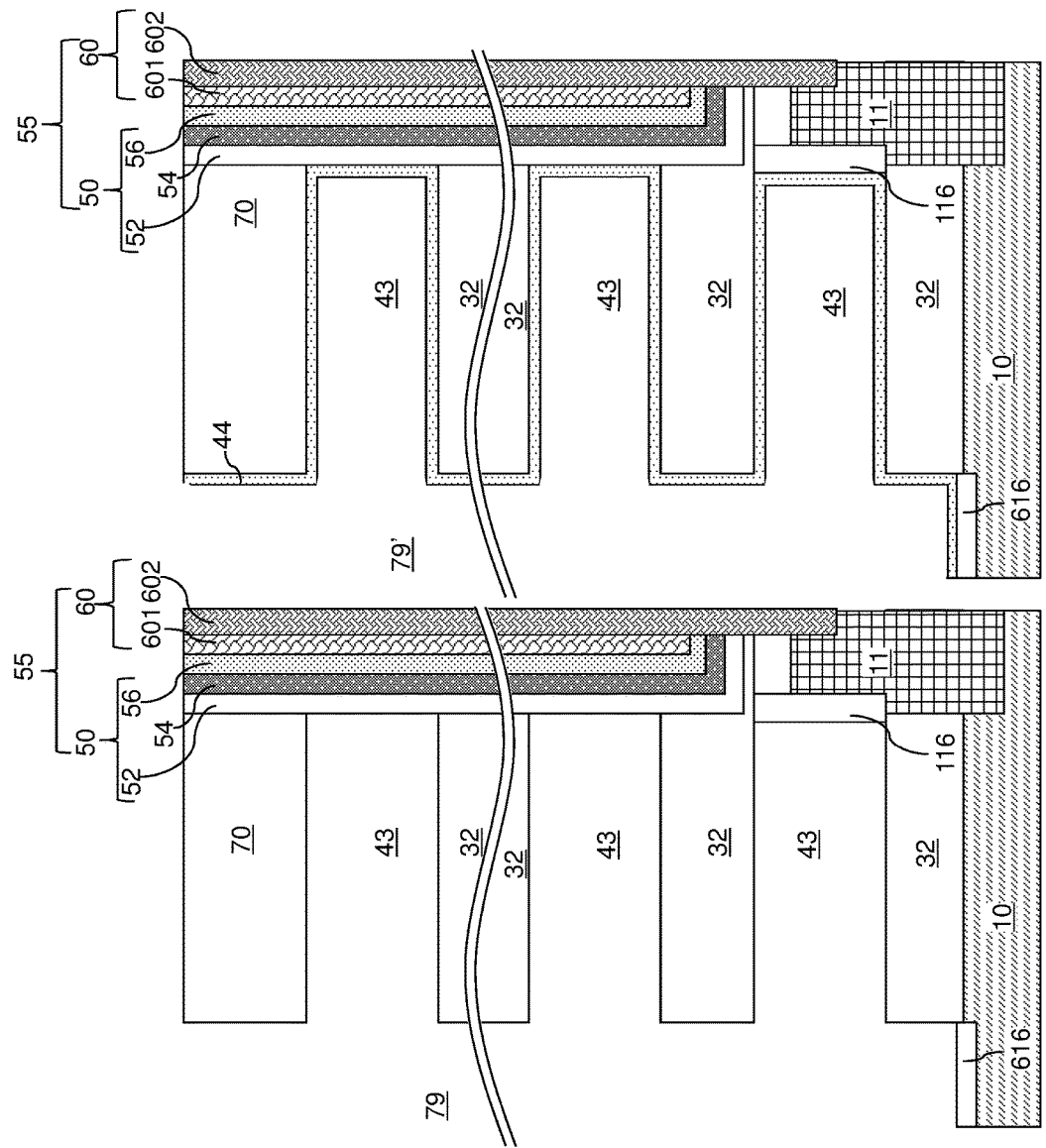

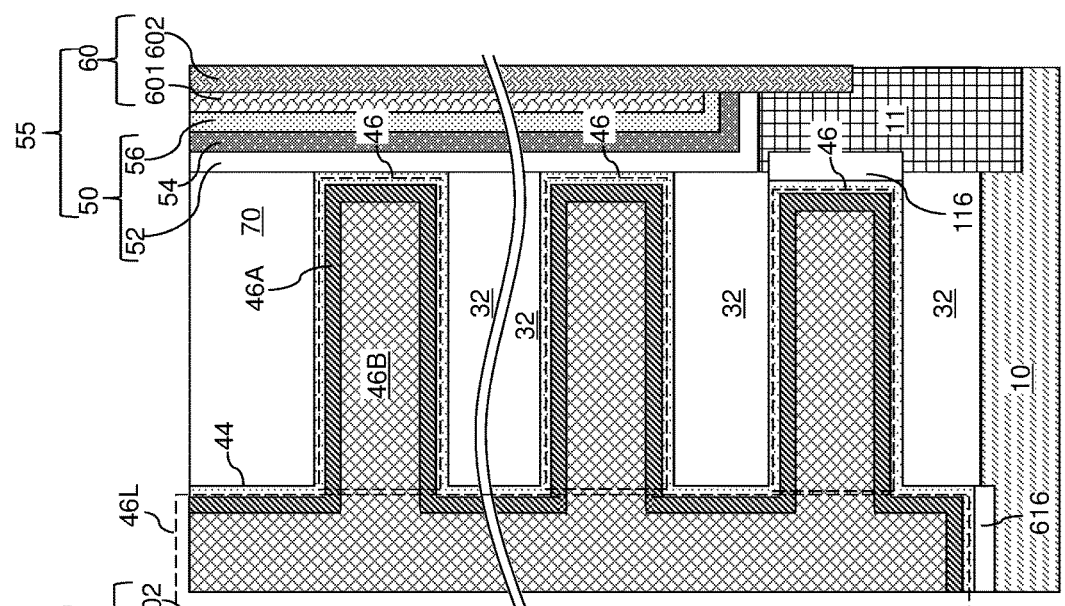
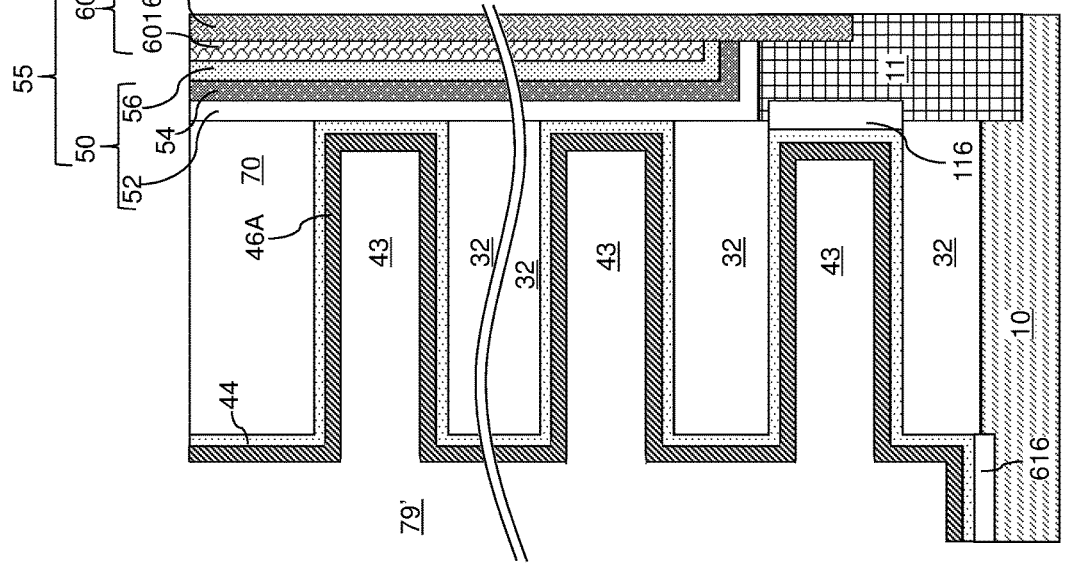

US 10,290,648 B1

THREE-DIMENSIONAL MEMORY DEVICE CONTAINING AIR GAP RAILS AND METHOD OF MAKING THEREOF

FIELD

The present disclosure relates generally to the field of semiconductor devices, and particular to a three-dimensional memory device including air gap rails between electrically conductive layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; memory stack structures extending through the alternating stack, wherein each of the memory stack structures comprises respective charge storage elements and a vertical semiconductor channel laterally surrounded by the respective charge storage elements; electrically conductive rails contacting a sidewall of a respective one of the electrically conductive layers and laterally extending along a horizontal direction; and a continuous insulating material layer including a vertical portion extending vertically from a bottommost one of the electrically conductive rails to a topmost one of the electrically conductive rails and laterally protruding portions that laterally protrude between each vertically neighboring pair of the electrically conductive rails, wherein the laterally protruding portions include air gap rails.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers; forming memory stack structures through the alternating stack, wherein each of the memory stack structures comprises respective charge storage elements and a vertical semiconductor channel laterally surrounded by the respective charge storage elements; forming a backside trench laterally extending along a horizontal direction through the alternating stack; forming electrically-conductive-layer-level recessed cavities by laterally recessing the electrically conductive layers around the backside trench; forming electrically conductive rails in the electrically-conductive-layer-level recessed cavities on remaining portions of the electrically conductive layers; forming insulating-layer-level recessed cavities by laterally recessing the insulating layers around the backside trench; and forming a continuous insulating material layer containing air gaps in the insulating-layer-level recessed cavities and the backside trench.

BRIEF DESCRIPTION OF THE DRAWINGS

FIG. 3 is a schematic vertical cross-sectional view of the exemplary structure after formation of stepped terraces and a retro-stepped dielectric material portion according to an embodiment of the present disclosure.

FIGS. 5A-5H are sequential schematic vertical cross-sectional views of a memory opening within the exemplary structure during formation of a memory stack structure, an optional dielectric core, and a drain region according to an embodiment of the present disclosure.

FIGS. 9A-9D are sequential vertical cross-sectional views of a region of the exemplary structure during formation of electrically conductive layers according to an embodiment of the present disclosure.

DETAILED DESCRIPTION

Figure 1:
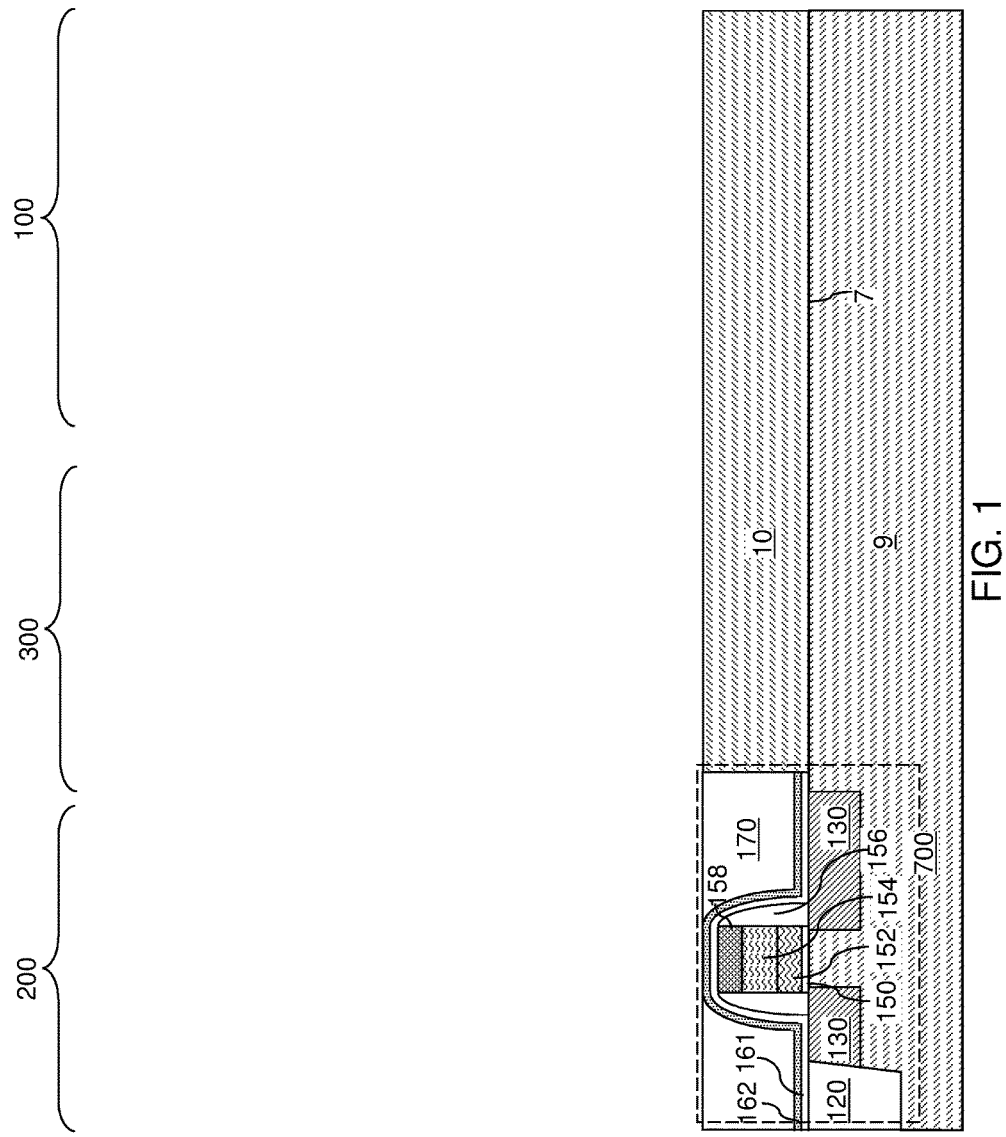
FIG. 1 is a schematic vertical cross-sectional view of an exemplary structure after formation of at least one peripheral device, a semiconductor material layer, and a gate dielectric layer according to an embodiment of the present disclosure.

The RC (i.e., the product of resistance and capacitance) delay of signals in the word lines adversely affects performance of a three-dimensional NAND memory device. As discussed above, the present disclosure is directed to a three-dimensional memory device including air gap rails between electrically conductive word lines to reduce of the RC delay for the word lines, and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
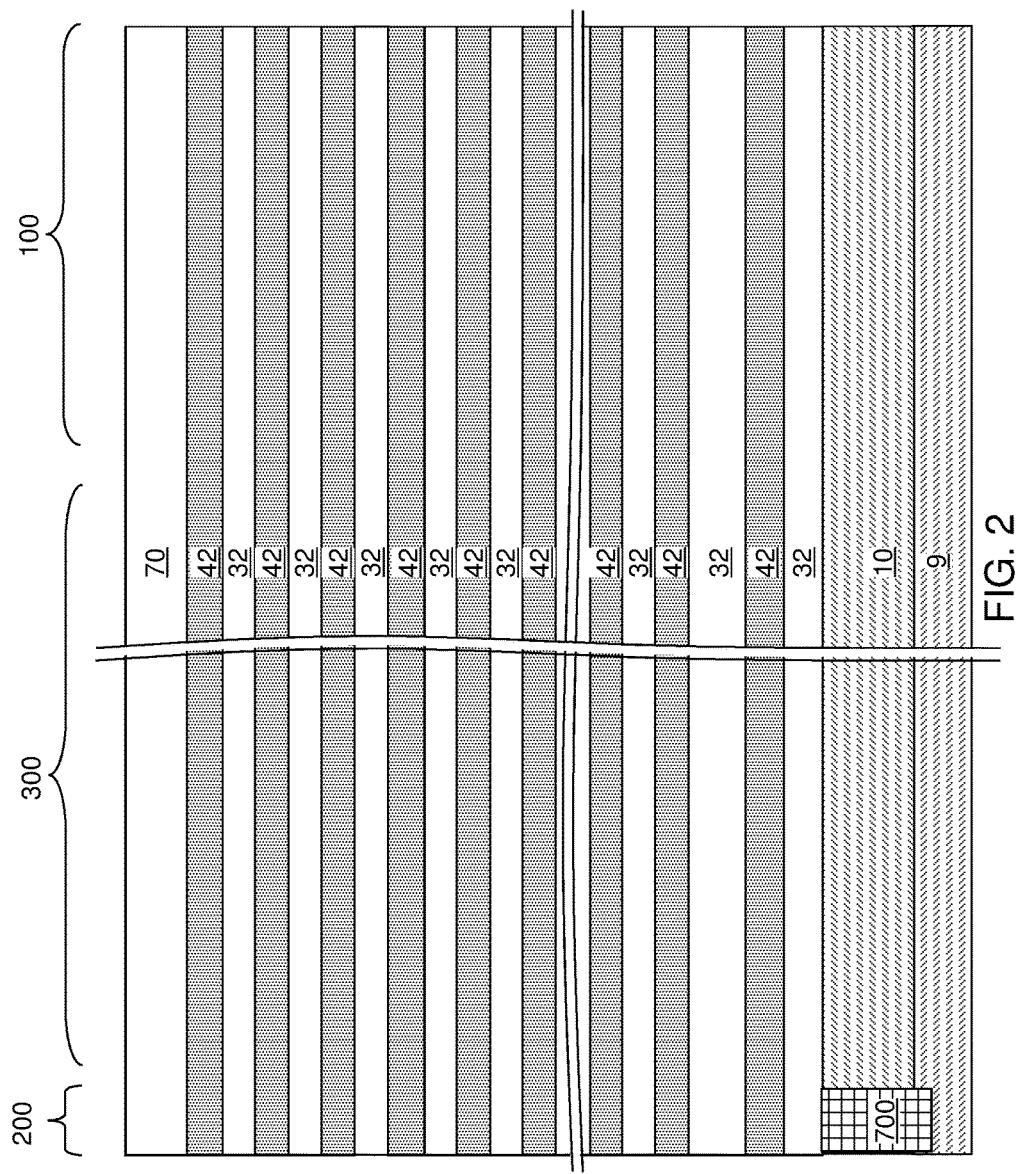
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
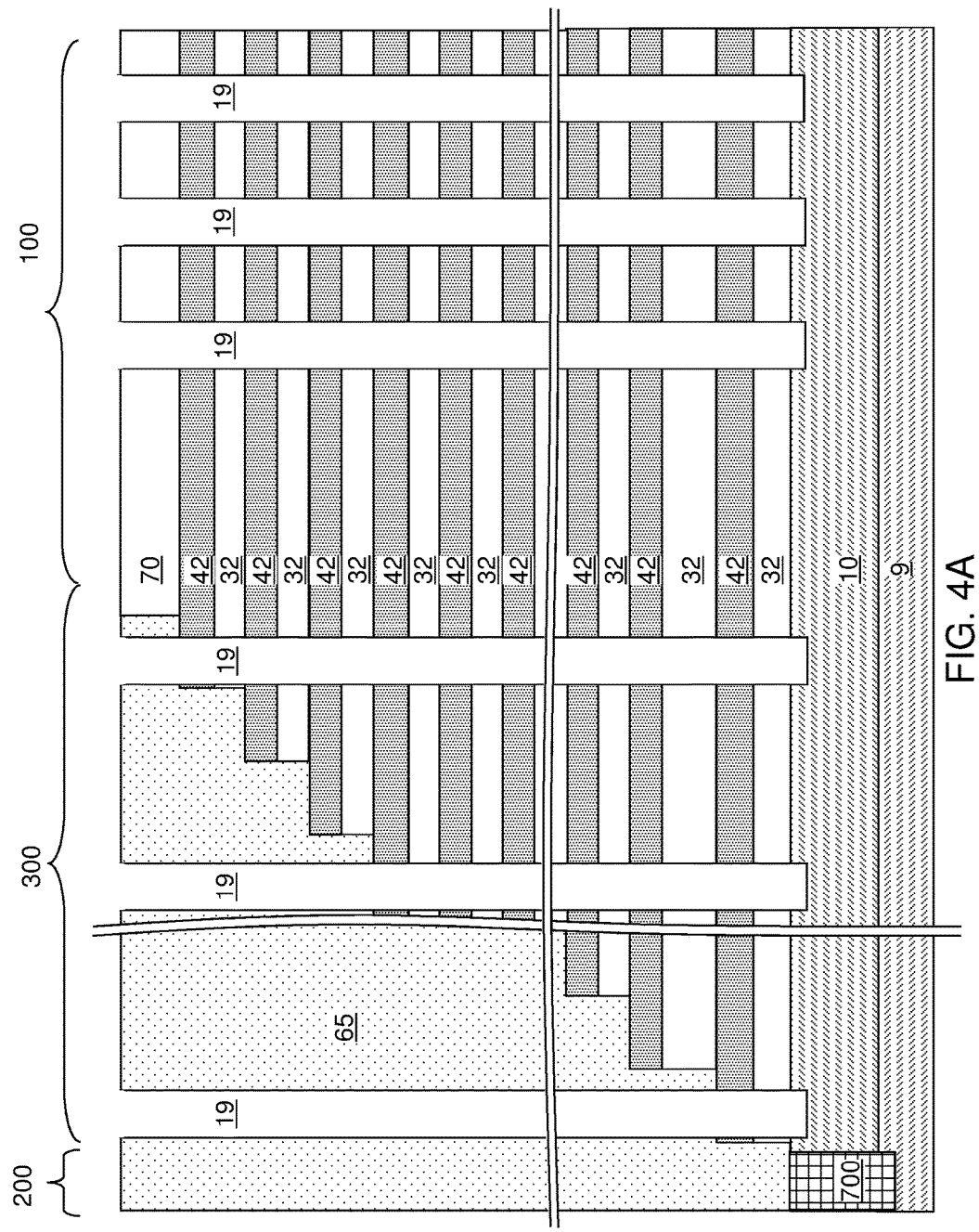
FIG. 4A is a schematic vertical cross-sectional view of the exemplary structure after formation of memory openings and support openings according to an embodiment of the present disclosure.
Figure 4B:
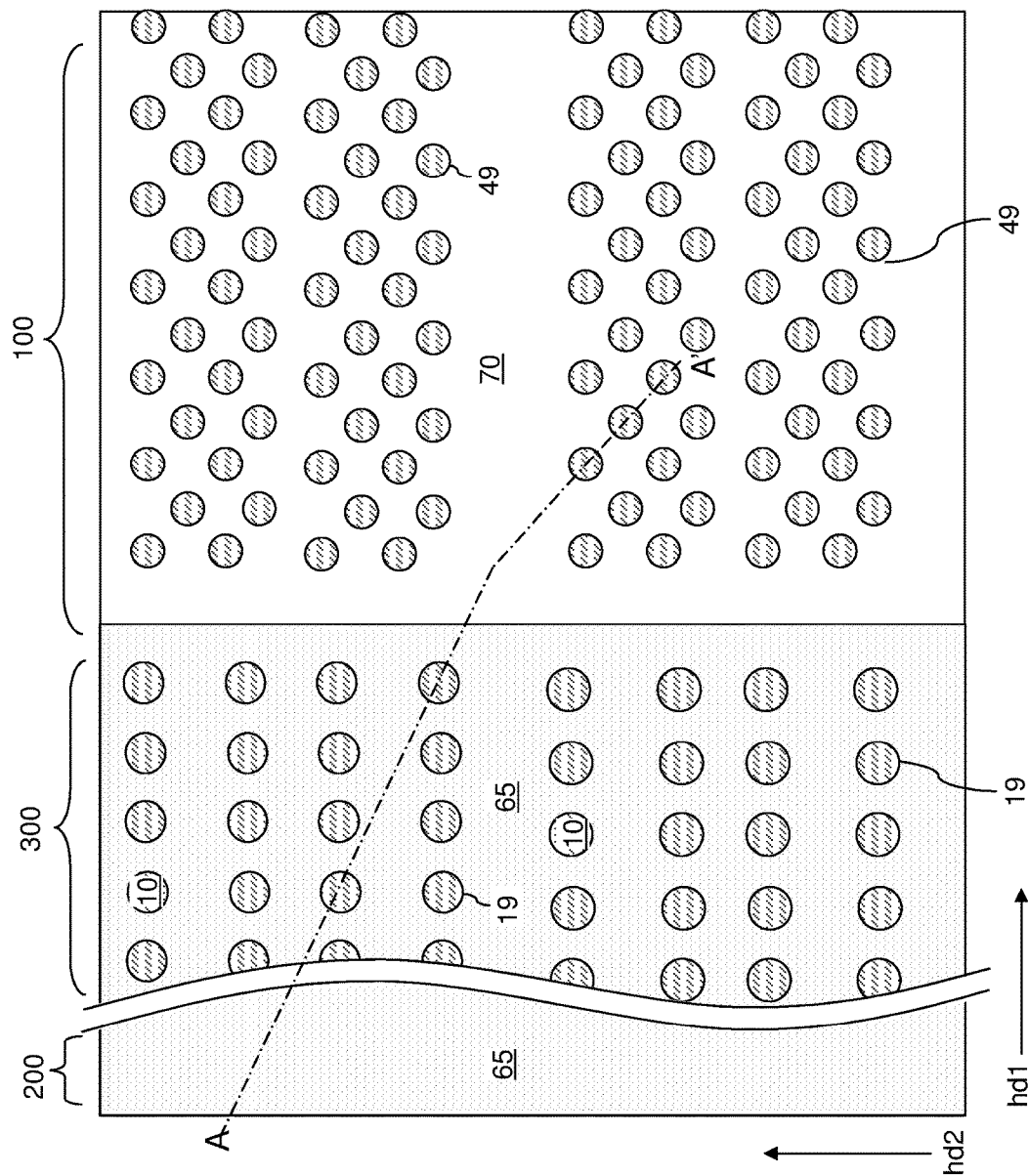
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
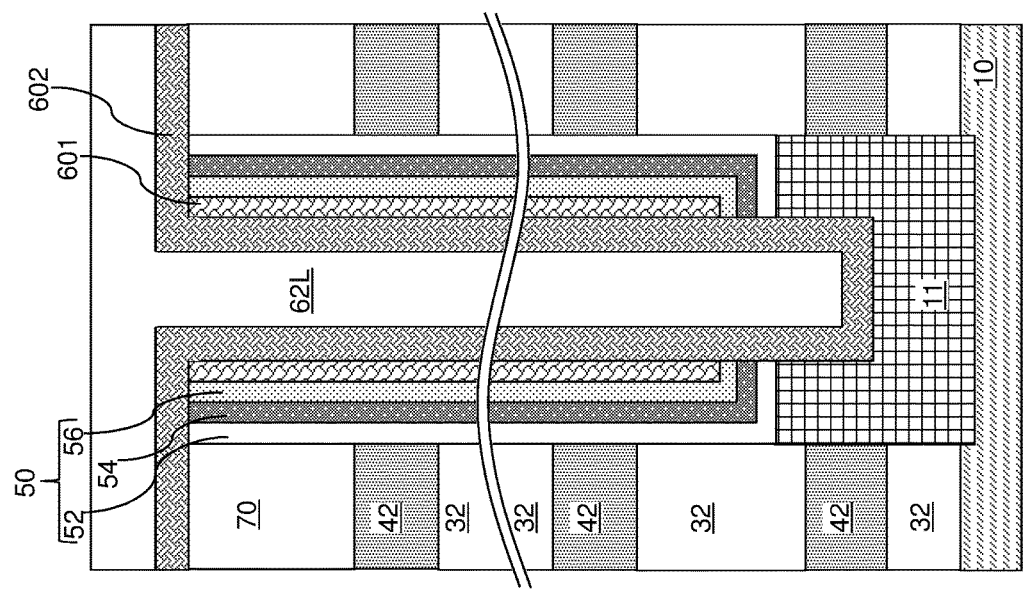

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
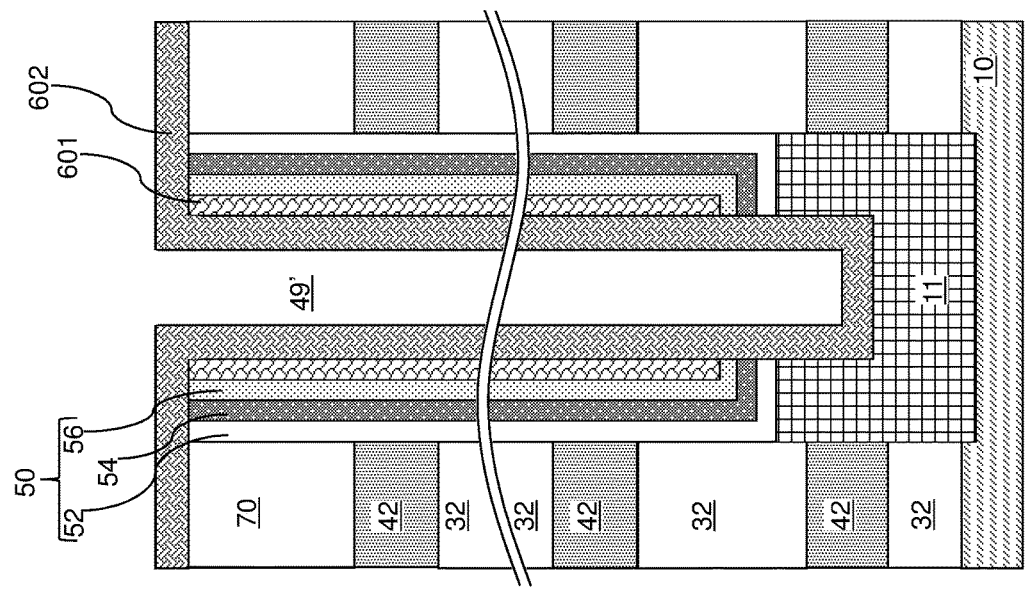

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
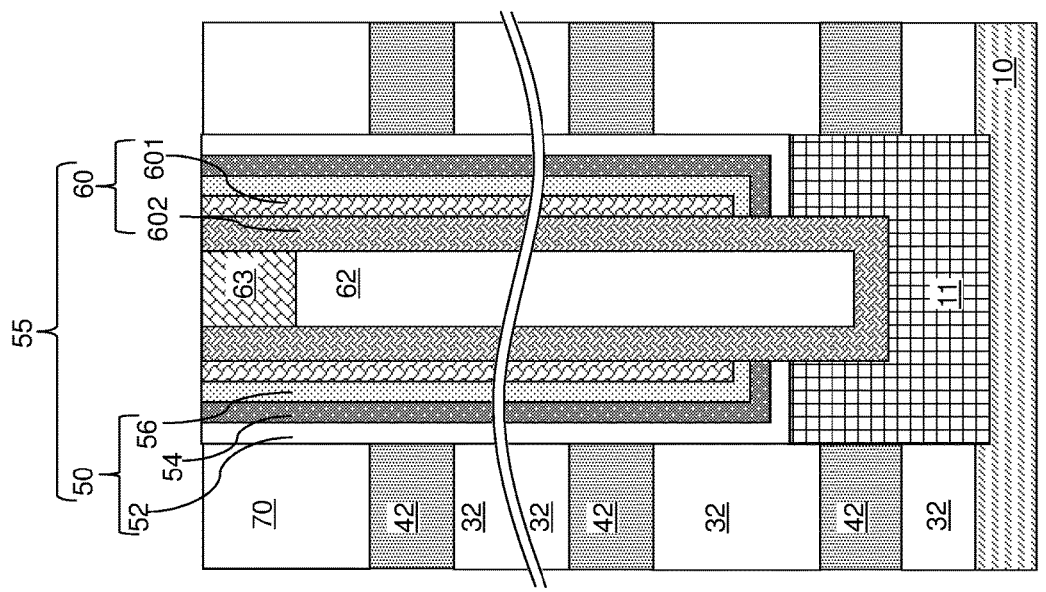

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
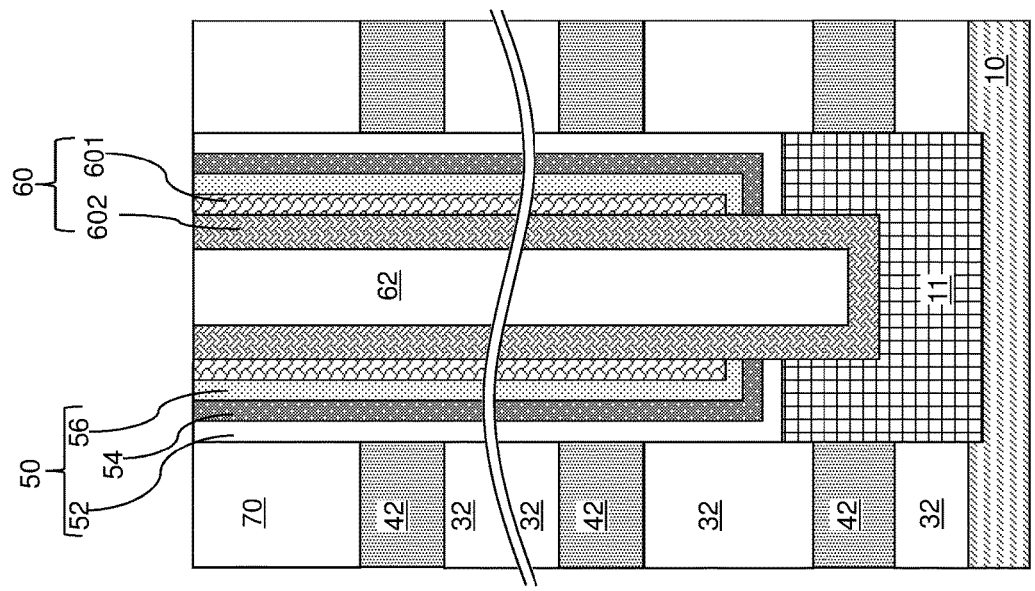

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20. See FIG. 6.

Figure 6:
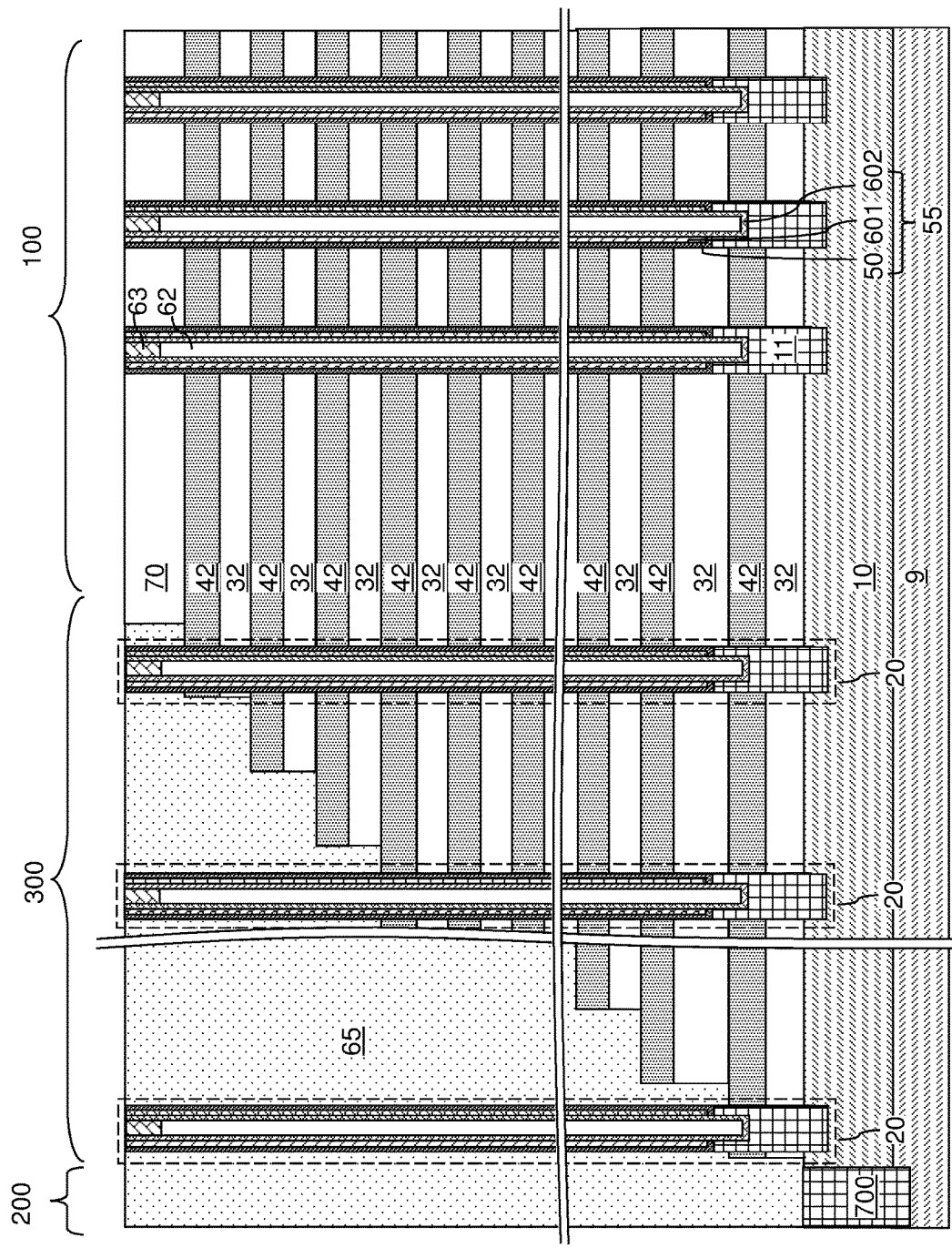
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure (11, 55, 62, 63) can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
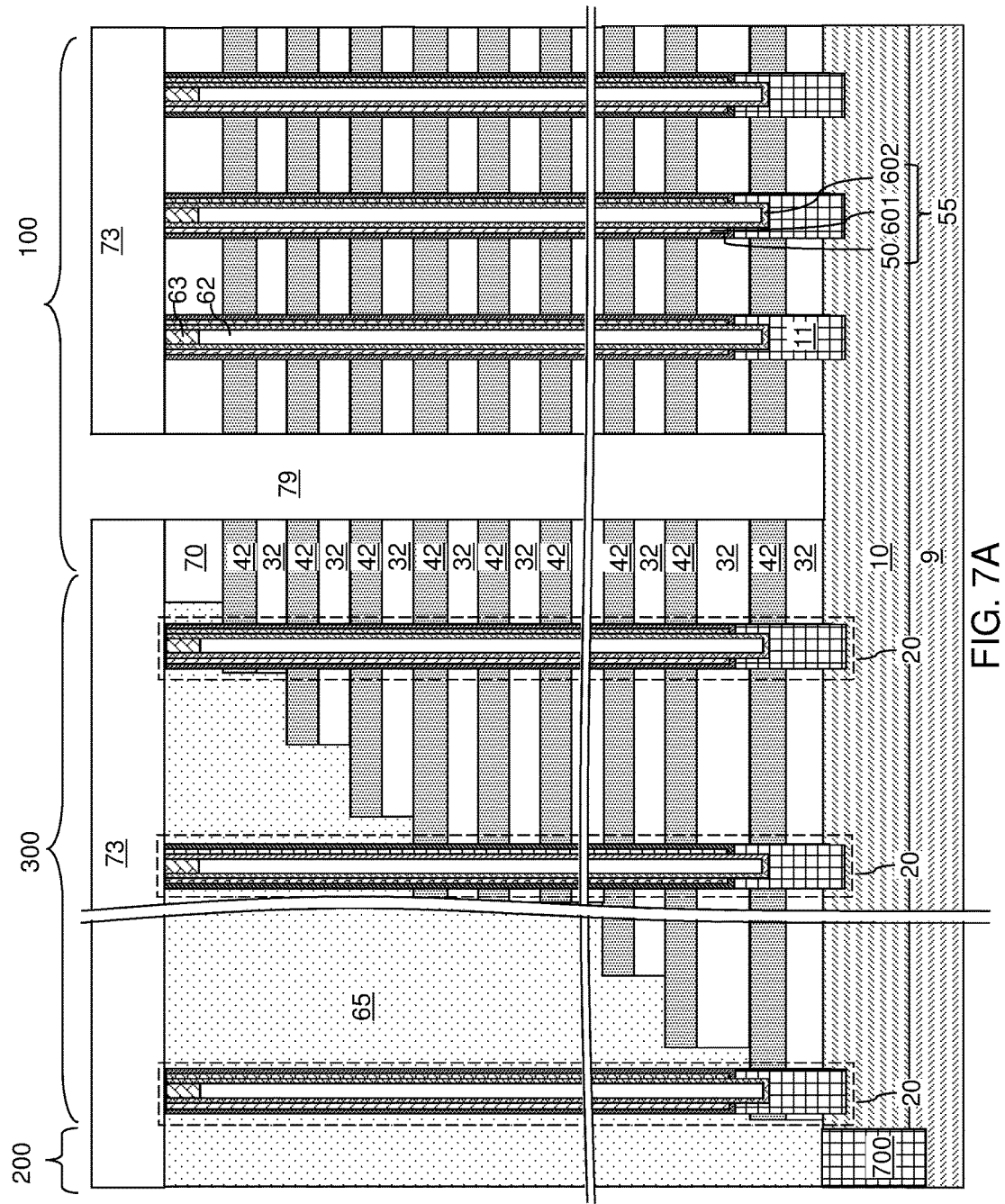
FIG. 7A is a schematic vertical cross-sectional view of the exemplary structure after formation of backside trenches according to an embodiment of the present disclosure.
Figure 7B:
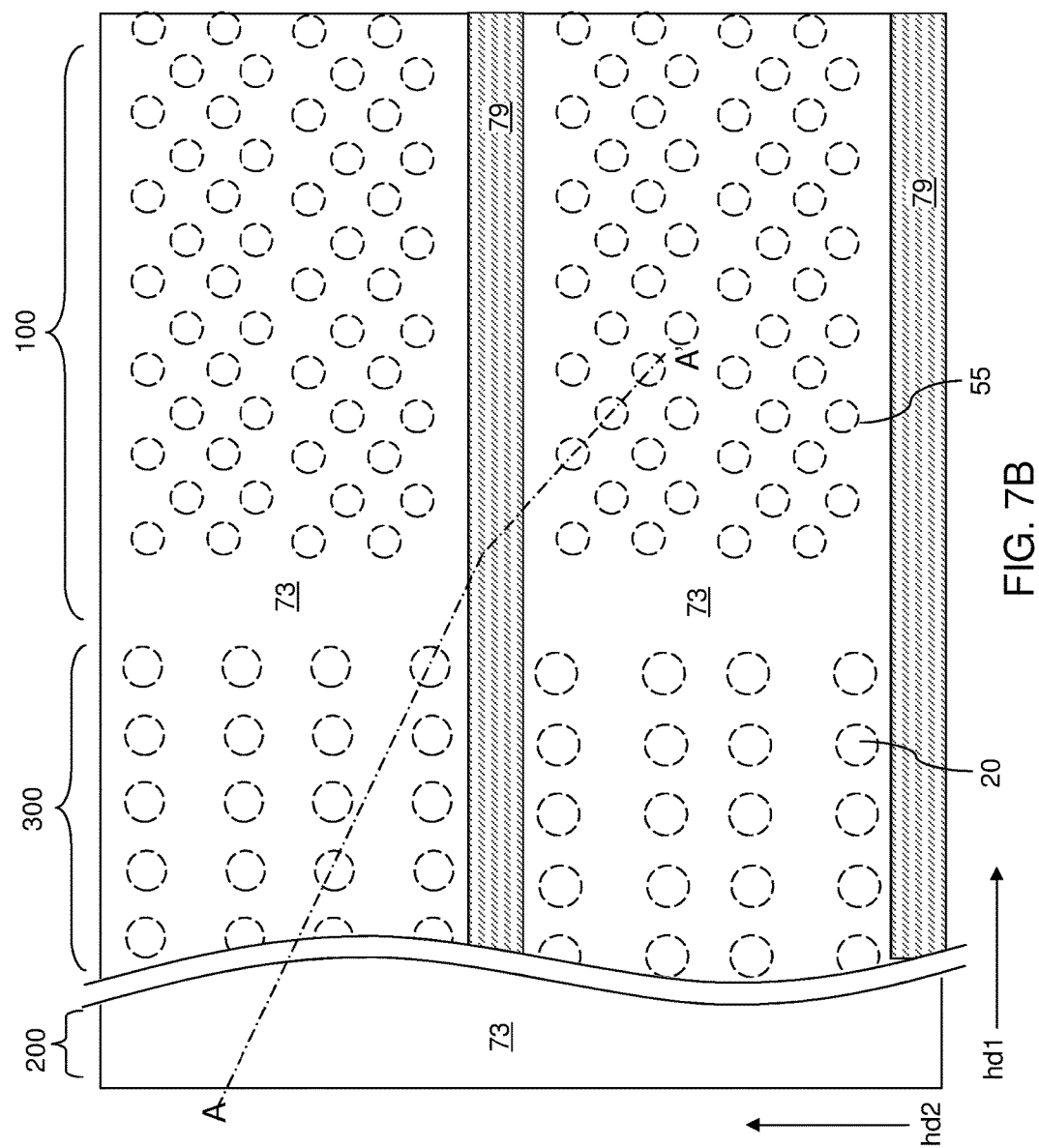
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
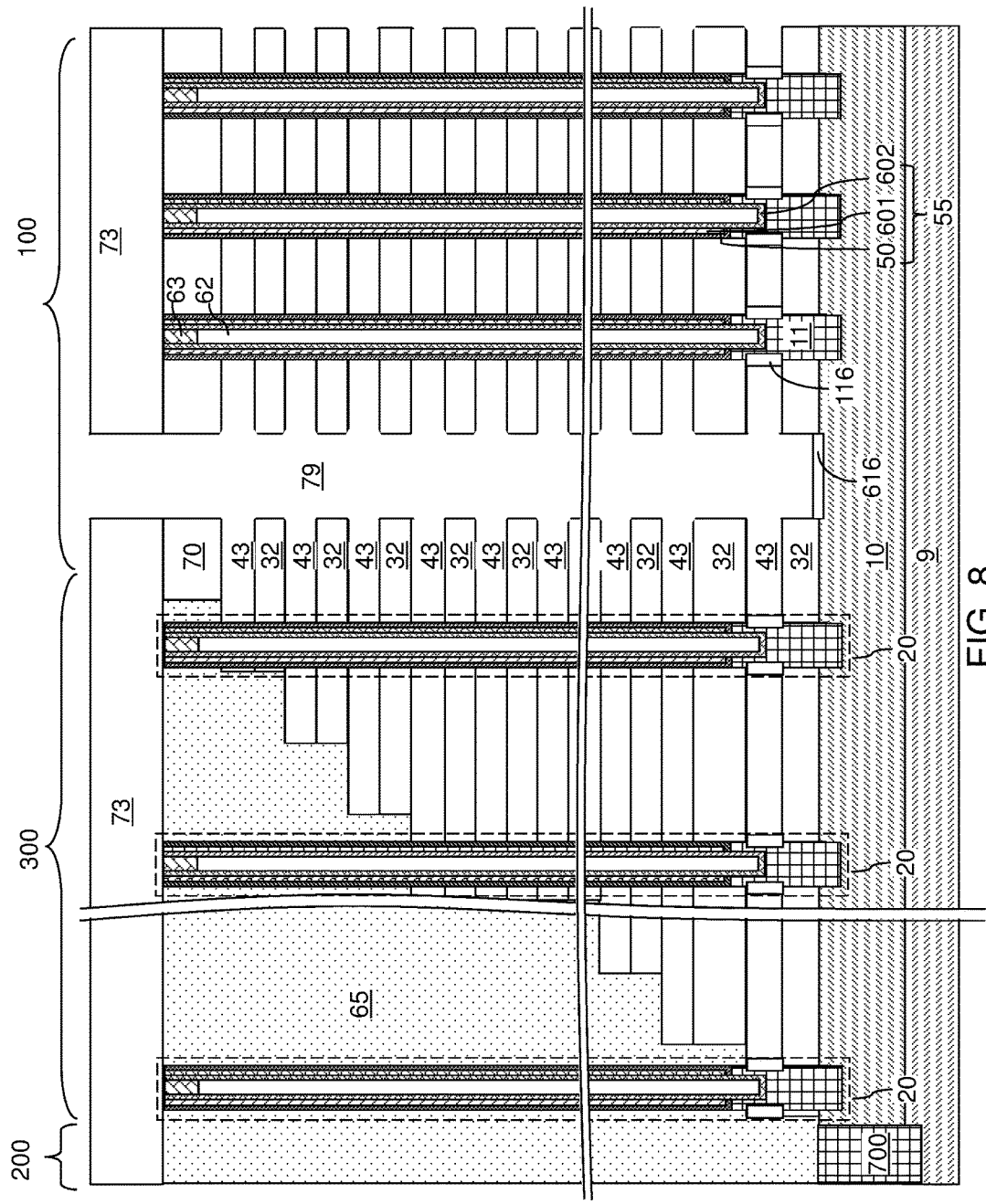
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79 as a continuous material layer, i.e., as a continuous backside blocking dielectric layer. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
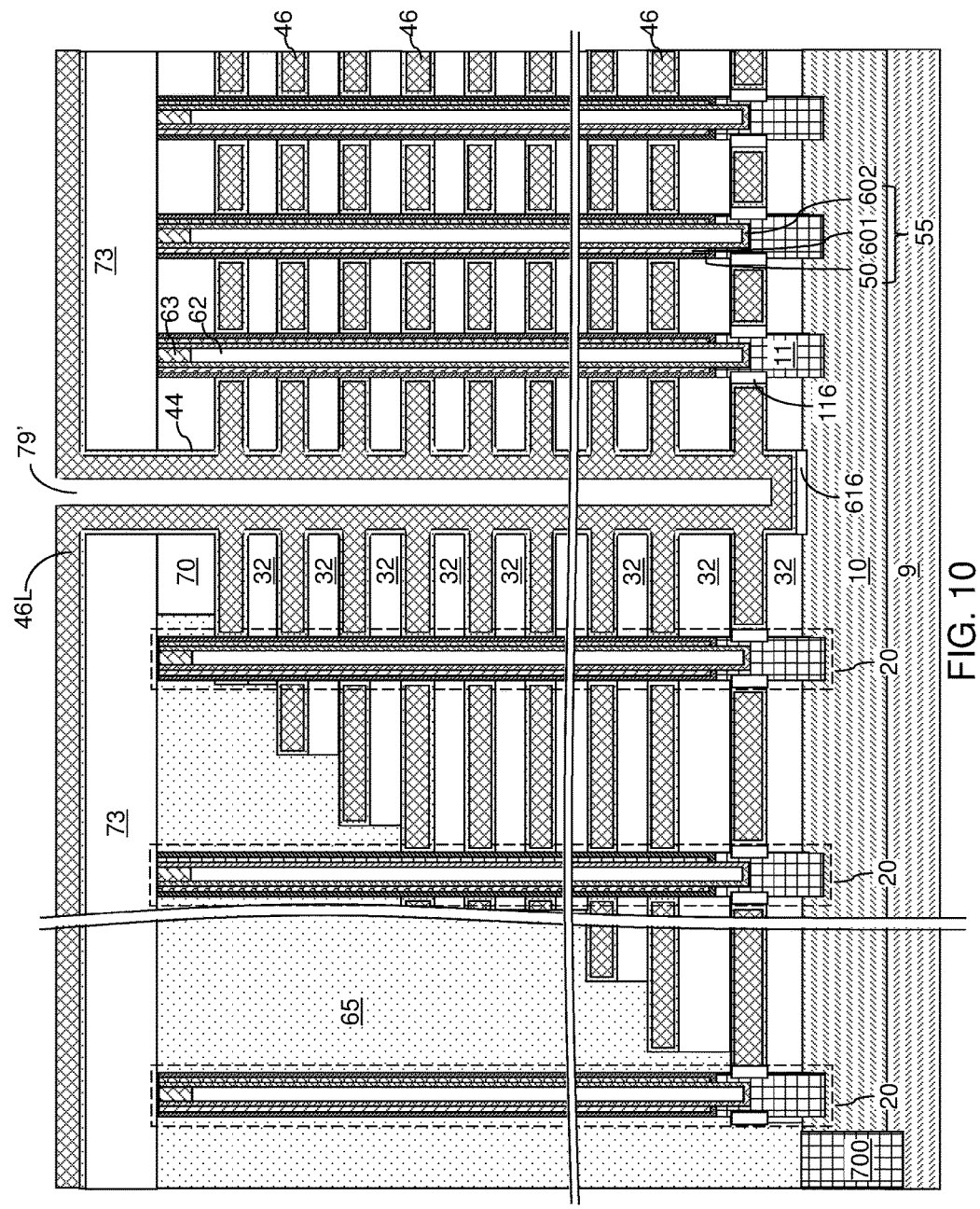
FIG. 10 is a schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
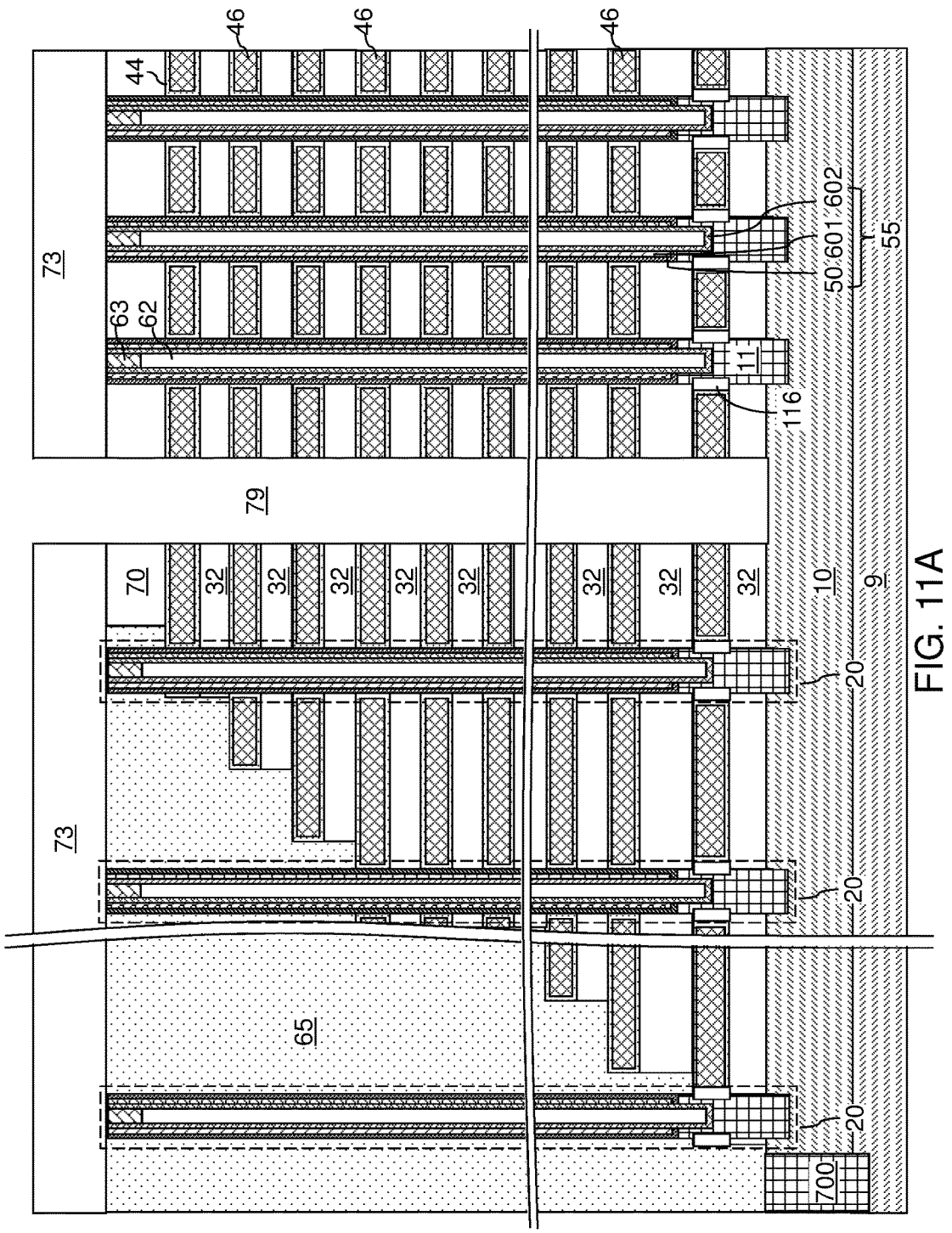
FIG. 11A is a schematic vertical cross-sectional view of the exemplary structure after removal of a deposited conductive material from within the backside trench according to an embodiment of the present disclosure.
Figure 11B:
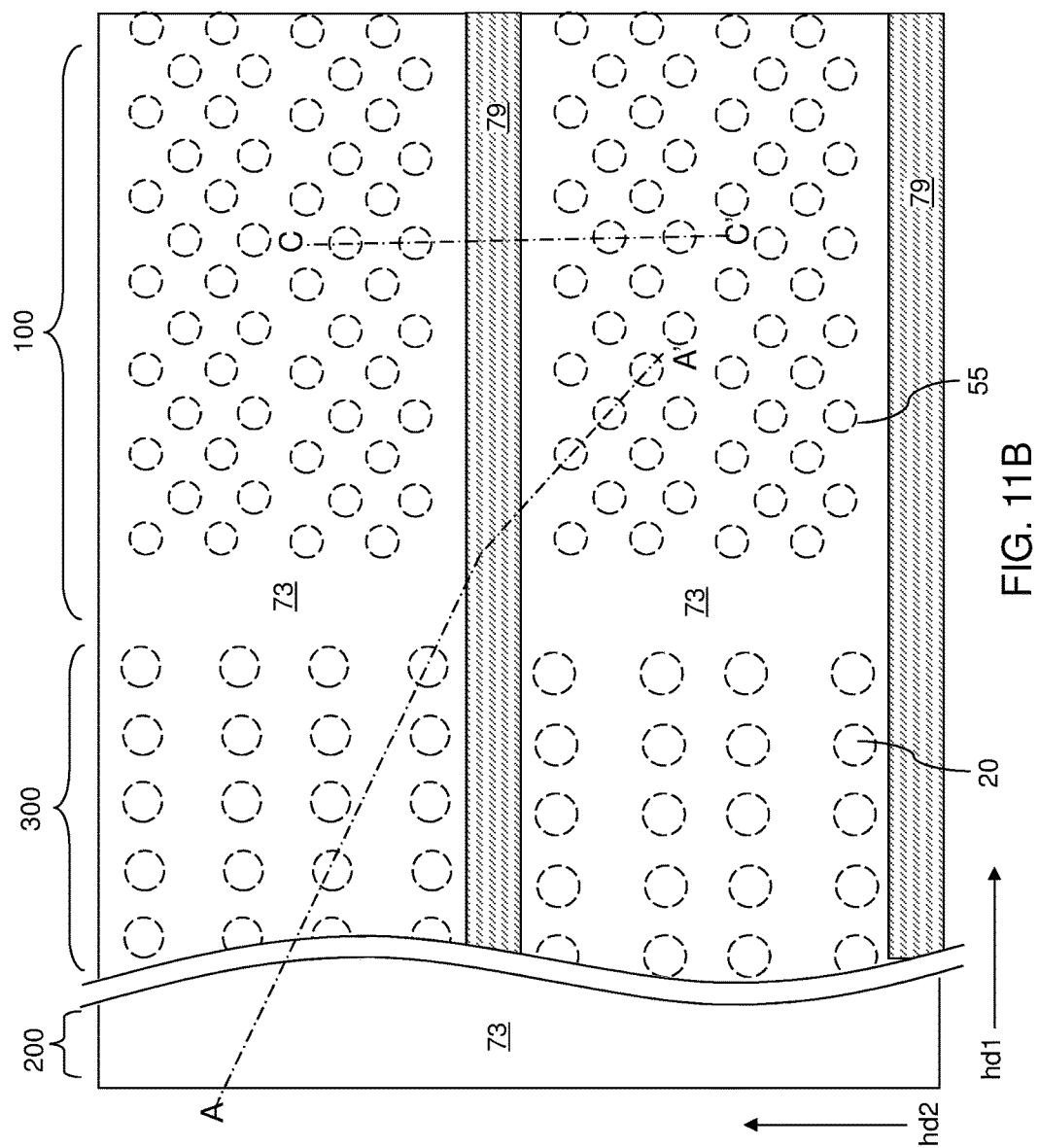
FIG. 11B is a partial see-through top-down view of the exemplary structure of FIG. 11A. The vertical plane A-A' is the plane of the schematic vertical cross-sectional view of FIG. 11A.
Figure 11C:
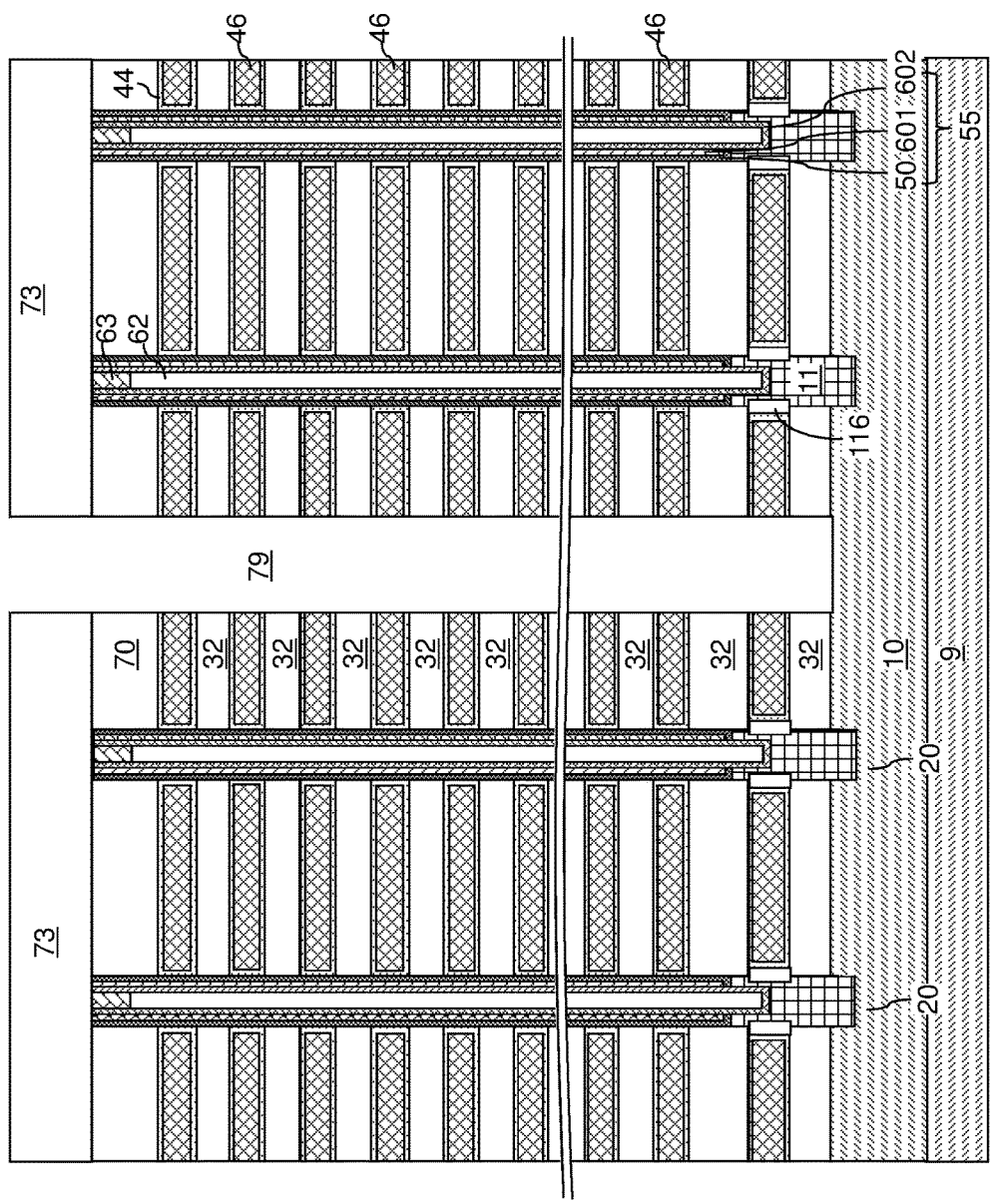
FIG. 11C is a schematic vertical cross-sectional view of the exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12:
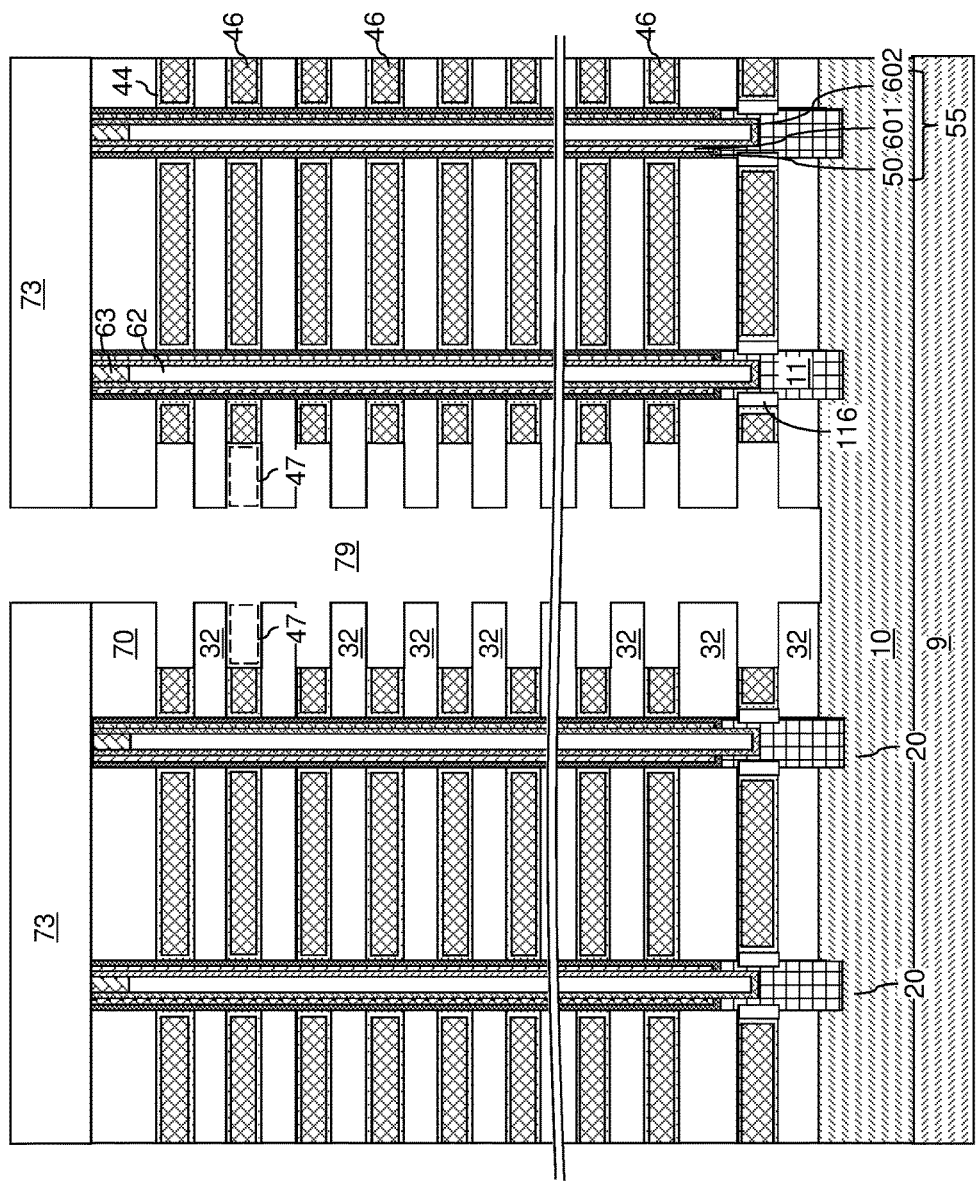
FIG. 12 is a schematic vertical cross-sectional view of the exemplary structure after formation of electrically-conductive-layer-level recessed cavities by laterally recessing the electrically conductive layers around each backside trench according to an embodiment of the present disclosure.

Referring to FIG. 12, the electrically conductive layers 46 can be laterally recessed by an isotropic etch process. The isotropic etch process can be a selective etch process that etches the material of the electrically conductive layers 46 selective to the material of the insulating layers 32 and the semiconductor material layer 10. For example, a wet etch process employing a mixture of hydrofluoric acid and nitric acid or a mixture of ammonium hydroxide and hydrogen peroxide can be used.

Recessed cavities are formed around each backside trench 79 at each level of the electrically conductive layers 46, which are herein referred to as electrically-conductive-layer-level recessed cavities 47, i.e., recessed cavities that are located at levels of the electrically conductive layers 46. The lateral recess distance of the isotropic etch process, i.e., the distance between a laterally recessed sidewall of each electrically conductive layer 46 and a most proximal sidewall of the backside trenches 79, can be in a range from 5 nm to 150 nm, such as from 10 nm to 75 nm, although lesser and greater lateral recess distances can also be employed.

Physically exposed portions of the backside blocking dielectric layers 44 can be removed after formation of the electrically-conductive-layer-level recessed cavities 47, for example, by another isotropic etch process. The isotropic etch process that removes the physically exposed portions of the backside blocking dielectric layers 44 can be a wet etch process employing a solution including one or more of phosphoric acid ($H_3PO_4$), ammonium hydroxide ($NH_4OH$), and tetramethylammonium hydroxide (TMAH). Horizontal surfaces of the insulating layers 32 can be physically exposed above and below each of the electrically-conductive-layer-level recessed cavities 47.

Figure 13:
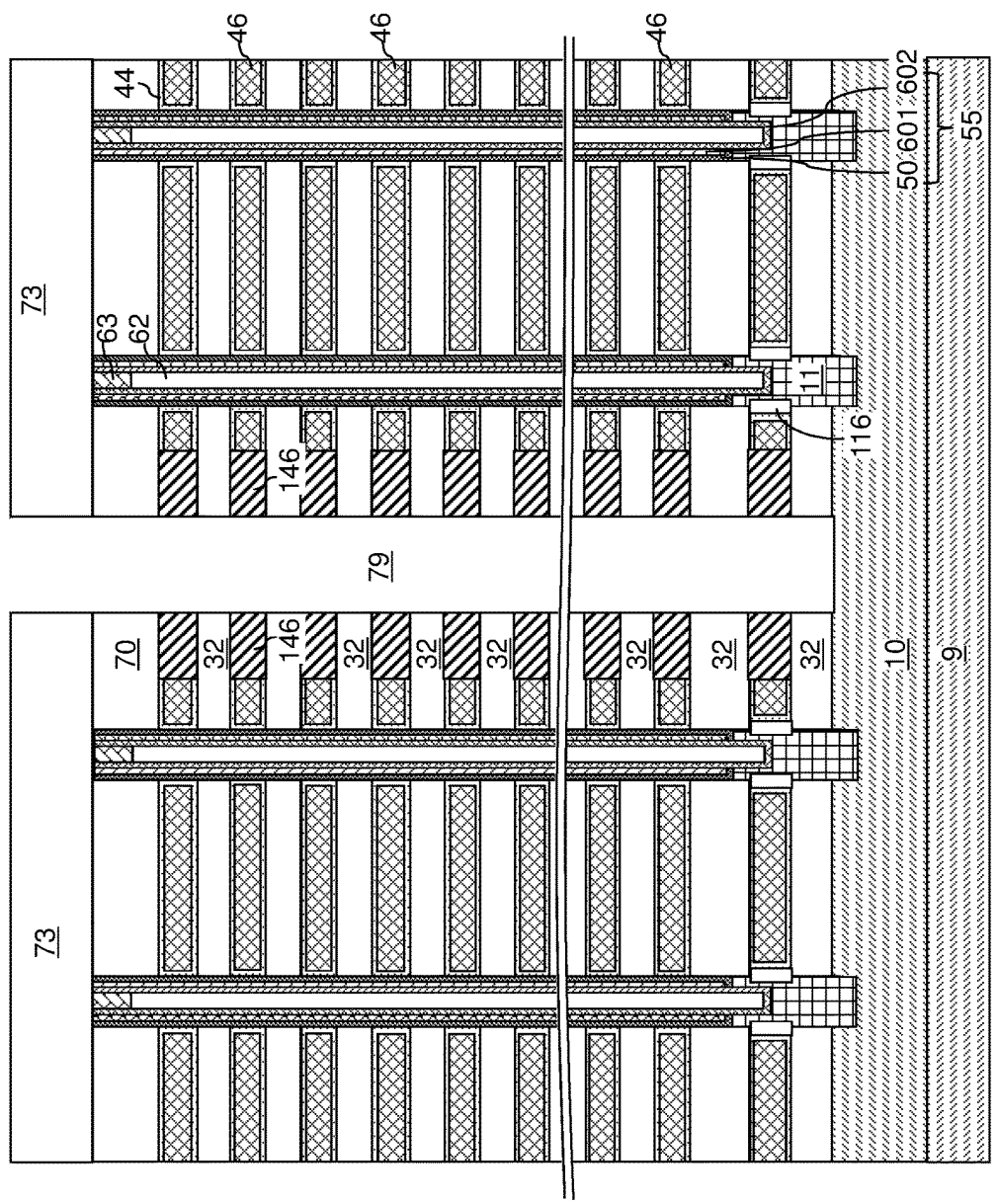
FIG. 13 is a schematic vertical cross-sectional view of the exemplary structure after forming electrically conductive rails in the electrically-conductive-layer-level recessed cavities according to an embodiment of the present disclosure.

Referring to FIG. 13, a metal can be deposited on the physically exposed sidewalls of the electrically conductive layers 46 in the electrically-conductive-layer-level recessed cavities 47 by a selective metal deposition process. The selective metal deposition process grows a metal from metallic surfaces, and does not grow the metal from non-metallic surfaces. A chemical vapor deposition process or an atomic layer deposition process can be employed for the selective metal deposition process. Metals that can be selectively deposited only on metallic surfaces without deposition on non-metallic surfaces include, for example, cobalt, tungsten, ruthenium, and nickel. In this case, a metal precursor including atoms of the metal, such as a metal organic precursor including atoms of the metal and other organic radicals, is provided in a gas phase into a process chamber in which the exemplary structure is disposed. The metal deposition proceed from the physically exposed sidewalls of the electrically conducive layers 46, which can include metal surfaces such as surfaces of tungsten, cobalt, or ruthenium. The metal does not grow from the dielectric surfaces of the insulating layers 32 or the surfaces of the semiconductor material layer 10.

In a non-limiting illustrative example, the selective metal deposition process can be a chemical vapor deposition process employing tungsten hexafluoride ($WF_6$) as a precursor. In this case, tungsten growth proceeds from metal surfaces of the electrically conductive layers 46, and does not proceed from the surfaces of the insulating layers 32 or the contact level dielectric layer 73. In another illustrative example, the selective metal deposition process can be an atomic layer deposition process employing ruthenium tetroxide ($RuO_4$) as a precursor and hydrogen as a reduction gas. In this case, ruthenium growth proceeds from metal surfaces of the electrically conductive layers 46, and does not proceed from the surfaces of the insulating layers 32 or the contact level dielectric layer 73. In yet another illustrative example, cobalt can be grown only from metallic surfaces while suppressing growth from insulating surfaces employing precursors such as bis(cyclopentadienyl)cobalt, bis(ethylcyclopentadienyl)cobalt, bis(ethylcyclopentadienyl)cobalt, or bis(pentamethylcyclopentadienyl)cobalt.

Electrically conductive rails 146 consisting essentially of a metal element can be formed within the electrically-conductive-layer-level recessed cavities 47 by the selective metal deposition process. As used herein, a "rail" or a "rail structure" refers to a structure that extends along a lengthwise direction. In one embodiment, the rail structure has a uniform cross-sectional view along planes that are perpendicular to the lengthwise direction and invariant under translation along the lengthwise direction. In this case, the vertical cross-sectional view of each electrically conductive rail 146 along vertical planes that are perpendicular to the lengthwise direction of the backside trench 79 adjacent to the electrically conductive rail 146 is invariant under translation along the lengthwise direction of the backside trench 79.

The duration and/or the number of deposition cycles in the selective metal deposition process can be selected such that the electrically conductive rails 146 fill at least 80% of the volumes of the electrically-conductive-layer-level recessed cavities 47. In one embodiment, each of the electrically-conductive-layer-level recessed cavities 47 can be completely filled by a respective one of the electrically conductive rails 146. Thus, the electrically conductive rails 146 can be formed directly on remaining portions of the electrically conductive layers 46 within the volumes of the electrically-conductive-layer-level recessed cavities 47. During the selective metal deposition process, the metal grows from the physically exposed surfaces of the electrically conductive layers 46 and does not grow from dielectric surfaces.

In one embodiment, the material of the electrically conductive rails 146 can have lower electrical resistivity than the material of the electrically conductive layers 46. Further, the height of each electrically conductive rail 146 can be greater than the height of the electrically conductive layer 46 contacted by the electrically conductive rail 146 by twice the thickness of the backside blocking dielectric layers 44. In addition, the electrically conductive rails 146 do not include any opening therein, whereas the electrically conductive layers 46 include openings through which the memory stack structures 55 extend vertically. Thus, each electrically conductive rail 146 can be employed as electrical current paths that augment current flow paths provided in the electrically conductive layers 46. The electrically conductive rails 146 have the overall effect of reducing the resistance of the electrically conductive paths for the word lines, each of which includes an electrically conductive layer 46 and an electrically conductive rail 146.

Figure 14:
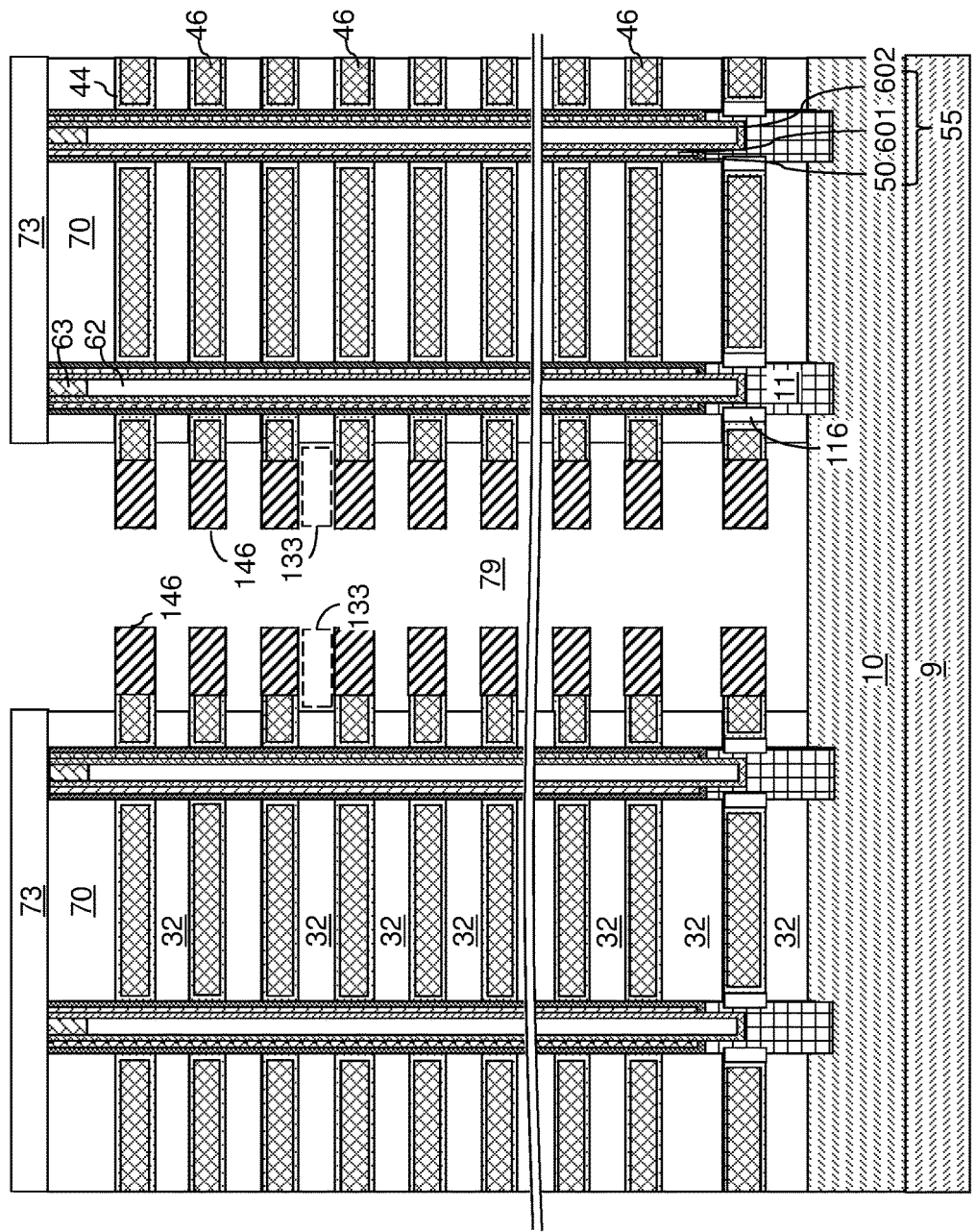
FIG. 14 is a schematic vertical cross-sectional view of the exemplary structure after formation of insulating-layer-level recessed cavities by laterally recessing the insulating layers around each backside trench according to an embodiment of the present disclosure.

Referring to FIG. 14, an isotropic etch process is performed to isotropically etch the material of the insulating layers 32 selective to the material of the electrically conductive rails 146. In one embodiment, the isotropic etch process can collaterally etch the contact level dielectric layer 73. For example, if the insulating layers 32 include a silicon oxide-based material (such as doped silicate glass or undoped silicate glass) and if the contact level dielectric layer 73 includes another silicon oxide-based material, the isotropic etch process can include a wet etch process employing dilute hydrofluoric acid. In this case, the insulating layers 32 and the contact level dielectric layer 73 can be simultaneously isotropically recessed during the isotropic etch process. In one embodiment, the isotropic etch process can be selective to the material of the backside blocking dielectric layers 44.

The insulating layers 32 are laterally recessed around each backside trench 79 by the isotropic etch process. Cavities are formed at each level of the insulating layers 32, which are herein referred to as insulating-layer-level recessed cavities 133. An insulating-layer-level recessed cavity 133 is formed between each vertically neighboring pair of electrically conductive rails 146. The lateral recess distance of the isotropic etch process, i.e., the lateral distance between a laterally recessed sidewall of each electrically conductive rails and a most proximal sidewall of an electrically conductive rail 146 that does not directly contact any electrically conductive layer 46, can be in a range from 5 nm to 250 nm, such as from 10 nm to 125 nm, although lesser and greater lateral recess distances can also be employed.

Figure 15:
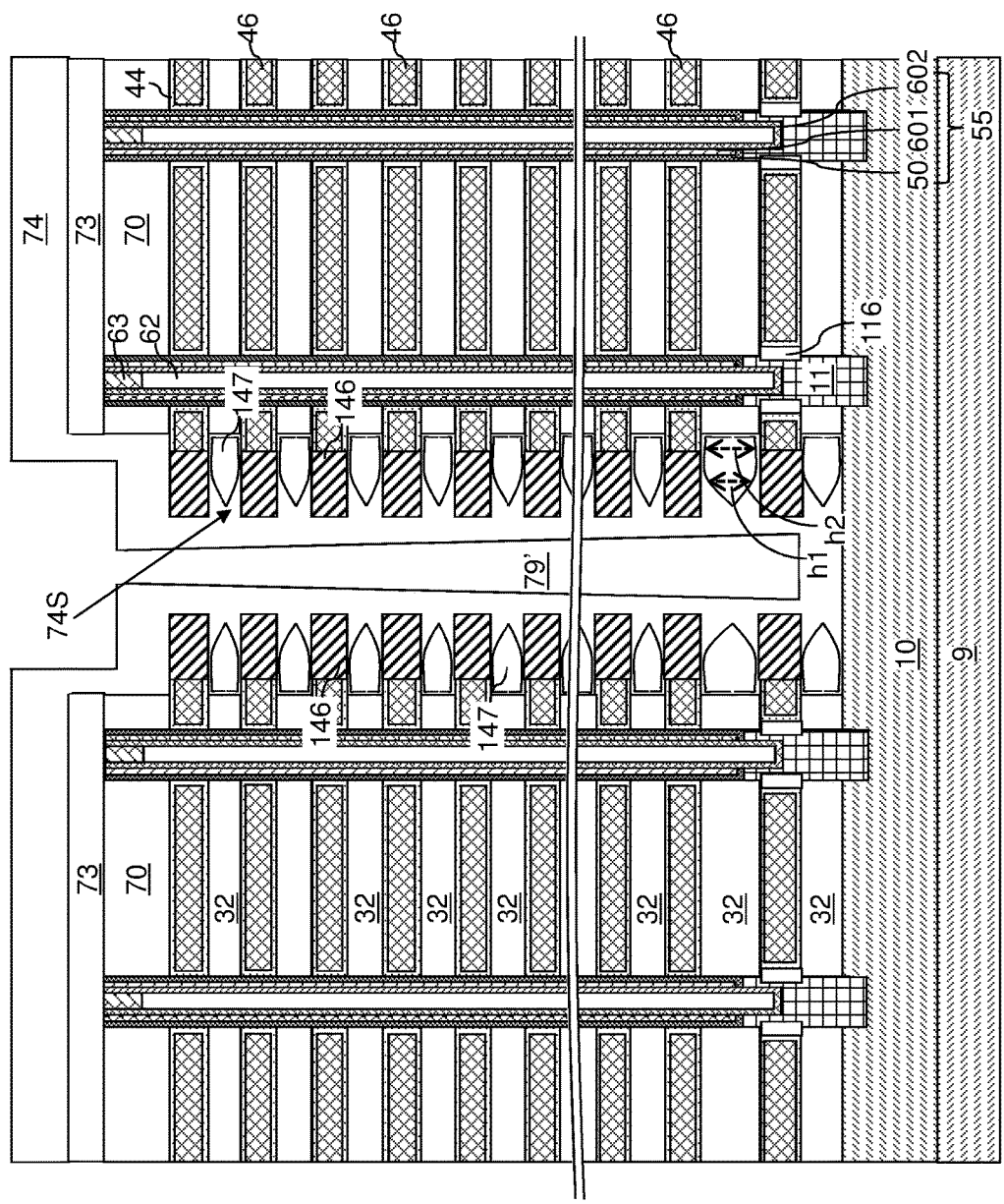
FIG. 15 is a schematic vertical cross-sectional view of the exemplary structure after formation of a continuous insulating material layer in the insulating-layer-level recessed cavities and each backside trench according to an embodiment of the present disclosure.

Referring to FIG. 15, a continuous insulating material layer 74 is formed by a non-conformal deposition process in the insulating-layer-level recessed cavities 133 and each backside trench 79. The non-conformal deposition process can be a directional deposition process and/or a depletive deposition process. A directional deposition process is a deposition process in which the deposited material exits a source with directionality, e.g., along a vertical direction that is perpendicular to the top surface of the substrate (9, 10). Exemplary directional deposition processes include physical vapor deposition and vacuum evaporation from an effusion cell or an e-beam source. A depletive deposition process is a deposition process in which the reactant is depleted significantly, for example, by a gas phase reaction or by a high reaction rate in a high aspect ratio structure, during movement toward a substrate. A depletive deposition process can result if the reaction temperature is relatively high and the supplied reactant is consumed predominantly at an upper portion of a high aspect ratio structure such as a backside trench 79. An alternative depletive deposition process includes plural alternating cycles of deposition and etching of the continuous insulating material layer 74.

Air gap rails 147 are formed within the insulating-layer-level recessed cavities 133. As used herein, an "air gap rail" is a rail structure including vacuum or at least one gas phase material only, and is completely enclosed by solid surfaces. As a rail structure, an air gap rail 147 laterally extends along the lengthwise direction of a most proximal backside trench 79. In one embodiment, the air gap rail 147 can have a vertical cross-sectional shape that is invariant with translation along the lengthwise direction of the most proximal backside trench 79. The vertical cross-sectional shape is defined within planes that are perpendicular to the lengthwise direction of the most proximal backside trench 79.

In case the non-conformal deposition process is a directional deposition process, the solid surfaces enclosing an air gap rail 147 can include a sidewall of an insulating layer 32, a bottom surface of an overlying electrically conductive rail 146, a top surface of an underlying electrically conductive rail 146, and a sidewall of the continuous insulating material layer 74. Optionally, the solid surfaces enclosing the air gap rail 147 can further include a bottom surface of an overlying one of the backside blocking dielectric layers 44 and a top surface of an underlying one of the backside blocking dielectric layers 44.

In case the non-conformal deposition process is a depletive deposition process, the solid surfaces enclosing an air gap rail 147 may consist of surfaces of the continuous insulating material layer 74. In this case, a thin layer portion of the continuous insulating material layer 74 can coat a sidewall of an insulating layer 32, a bottom surface of an overlying electrically conductive rail 146, and a top surface of an underlying electrically conductive rail 146, and can be adjoined to a vertical portion of the continuous insulating material layer 74. In this case, each air gap rail 147 can be bounded by two concave surfaces of the continuous insulating material layer 74 that are adjoined along a horizontal seam 74S that laterally extends along the lengthwise direction of a most proximal backside trench 79.

In one embodiment, the continuous insulating material layer completely fills the backside trench 79. In another embodiment, the continuous insulating material layer 74 partially fills the backside trench and includes vertical portions that vertically extend along the peripheries of the backside trenches 79 and a horizontal portion that overlies the contact level dielectric layer 73. The horizontal portion of the contact level dielectric layer 73 can be connected to the vertical portions through L-shaped portions that overlie the electrically conductive rails 146 located at the topmost level of the electrically conductive layers 46. In this embodiment, each vertical portion of the continuous insulating material layer 74 can have a variable lateral width that increases with a vertical distance from the substrate (9, 10). The deposited material within the continuous insulating material layer 74 can include a dielectric material having a homogeneous composition. For example, the deposited material within the continuous insulating material layer 74 can consist essentially of a porous or non-porous organosilicate glass material, a doped silicate glass, or an undoped silicate glass. In one embodiment, the each solid portion of the continuous insulating material layer 74, such as the vertical portions of the continuous insulating material layer 74, can include a dielectric material having a lower dielectric constant than the insulating layers. For example, the insulating layers 32 can include a doped or undoped silicate glass, and the solid portions of the continuous insulating material layer 74 can include a doped silicate glass having a lower dielectric constant or a porous or non-porous organosilicate glass.

Each vertical portion of the continuous insulating material layer 74 can extend vertically from a bottommost one of the electrically conductive rails 146 to a topmost one of the electrically conductive rails 146. In one embodiment, the continuous insulating material layer 74 can include laterally protruding portions that laterally protrude between each vertically neighboring pair of the electrically conductive rails 146. In one embodiment, each laterally protruding portion can include an air gap rail 147, which includes a respective laterally extending cavity that extends along the lengthwise direction of a most proximal backside trench 79 with a respective vertical cross-sectional shape that is invariant along the lengthwise direction.

In one embodiment, the lateral recess distance of the isotropic etch process that forms the insulating-layer-level recessed cavities 133 can be greater than the lateral recess distance that forms the electrically-conductive-layer-level recessed cavities 47. In this case, horizontal surfaces of the backside blocking dielectric layers 44 can be physically exposed to the insulating-layer-level recessed cavities 133. If a depletive deposition process is employed to form the continuous insulating material layer 74, the continuous insulating material layer 74 can be formed directly on horizontal surfaces of the backside blocking dielectric layers 44 (which are remaining portions of the continuous backside blocking dielectric layer as originally formed) in the insulating-layer-level recessed cavities 133.

A backside cavity 79' that is not filled with the material of the continuous insulating material layer 74 can be present in each backside trench 79. In one embodiment, the lateral width of the backside cavity 79' can decrease with a vertical distance from the top surface of the substrate (9, 10).

Figure 16:
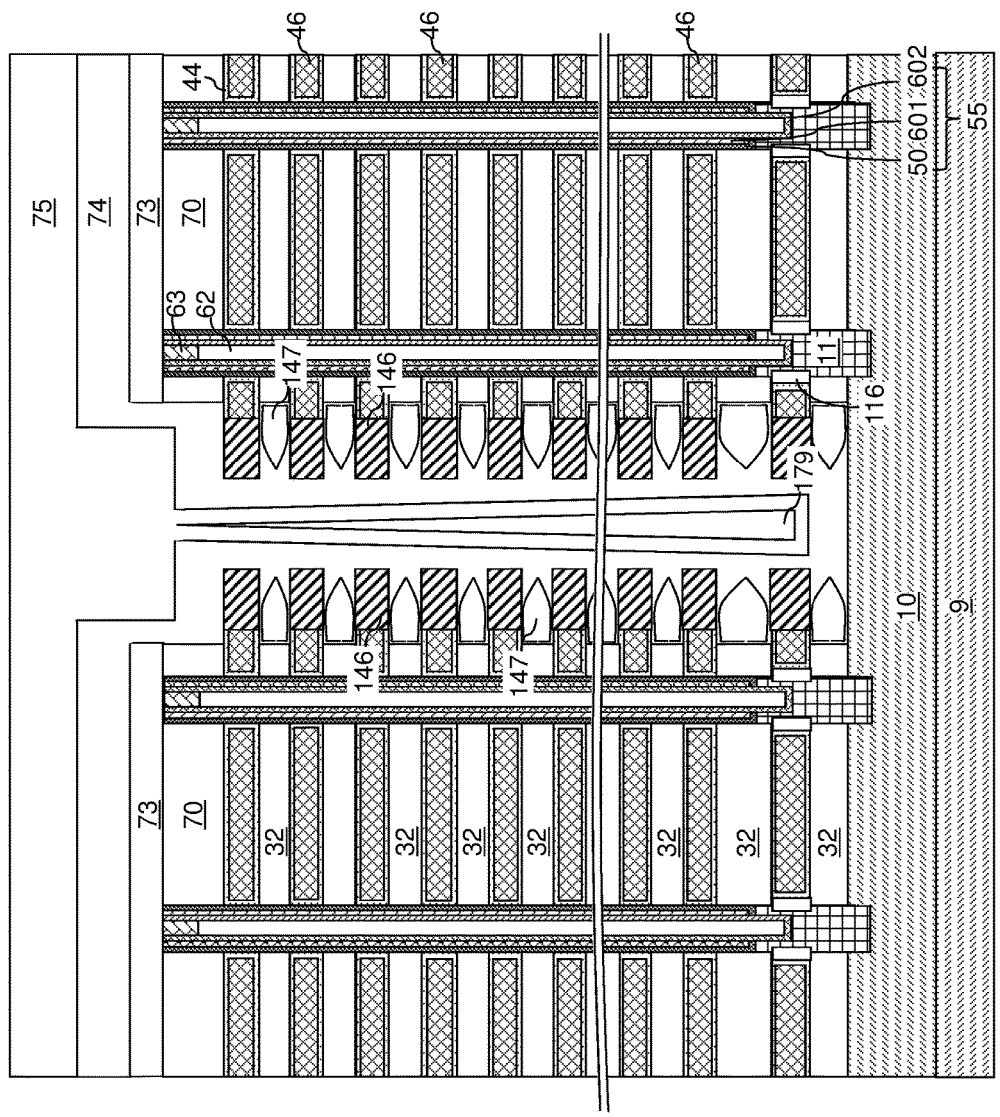
FIG. 16 is a schematic vertical cross-sectional view of the exemplary structure after formation of a conformal dielectric fill material layer in the backside trenches and over the alternating stack according to an embodiment of the present disclosure.

Referring to FIG. 16, a conformal dielectric fill material layer 75 can be optionally deposited in the backside cavities 79' and over the horizontal portions of the continuous insulating material layer 74. The conformal dielectric fill material layer 75 includes a dielectric material such as silicon oxide, and can be deposited by a conformal deposition process such as chemical vapor deposition. In one embodiment, a vertically-extending cavity 179 that vertically extends through at least one half of all electrically conductive layers 46 within the alternating stack (32, 46) of insulating layers and electrically conductive layers 46 can be formed within each backside trench 79. Each vertically-extending cavity 179 can be formed inside the continuous insulating material layer 74. Each vertically-extending cavity 179 can be laterally spaced from each of adjacent laterally extending cavities in the air gap rails 147 by a vertical portion of the continuous insulating material layer 74 and a vertical portion of the conformal dielectric fill material layer 75. In this case, each vertically-extending cavity 179 can be bounded by surfaces of, and can be entirely encapsulated by, the conformal dielectric fill material layer 75.

Alternatively, formation of the conformal dielectric fill material layer 75 can be omitted, and the non-conformal deposition process that forms the continuous insulating material layer 74 can be prolonged until a vertically-extending cavity 179 is formed within each portion of the continuous insulating material layer 74 located within the backside trenches 79. In other words, the conformal dielectric fill material layer 75 may be replaced with additionally deposited portions of the continuous insulating material layer 74. In this case, each vertically-extending cavity 179 can be bounded by surfaces of, and can be entirely encapsulated by, the continuous insulating material layer 74.

Yet alternatively, a self-planarizing dielectric material layer can be deposited in lieu of the conformal dielectric fill material layer 75. The self-planarizing dielectric material layer can include, for example, a spin-on glass (SOG) material. Other self-planarizing dielectric material can also be employed. If a self-planarizing dielectric material layer is formed in lieu of the conformal dielectric fill material layer 75, each volume inside the continuous insulating material layer 74 within the backside trenches 79 can be filled entirely with the material of the self-planarizing dielectric material layer without forming any cavity therein.

Figure 17A:
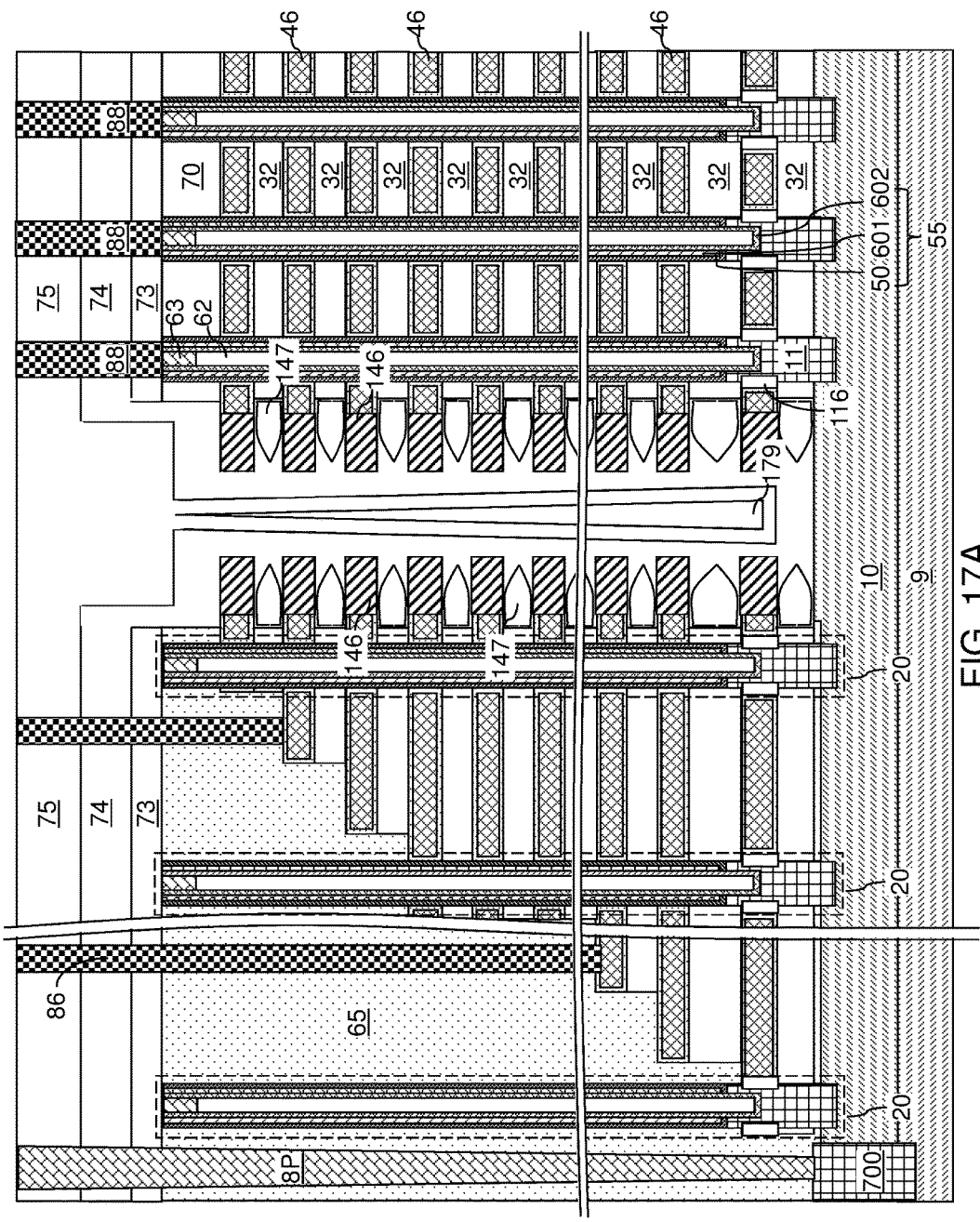
FIG. 17A is a schematic vertical cross-sectional view of the exemplary structure after formation of contact via structures according to an embodiment of the present disclosure.
Figure 17B:
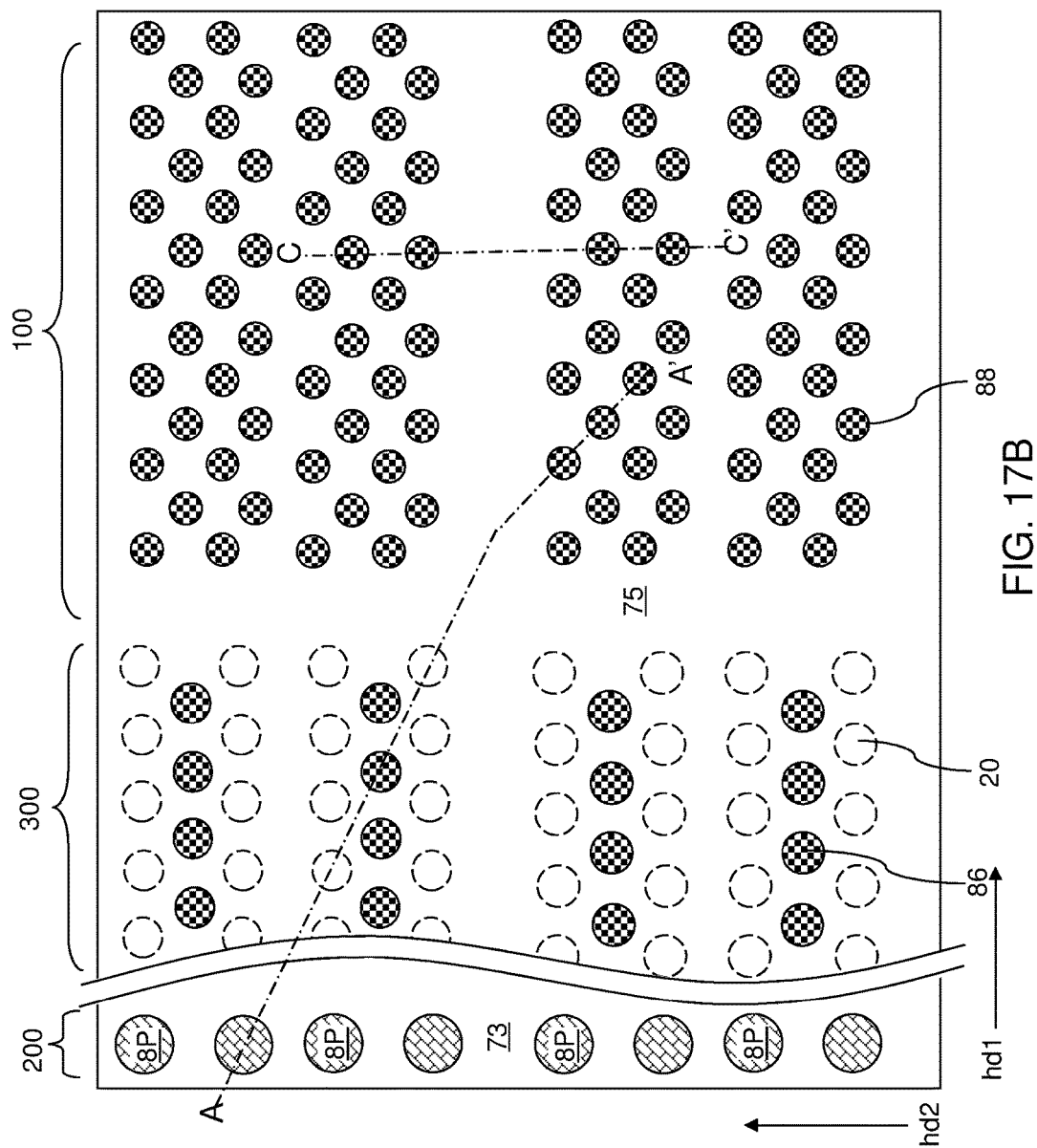
FIG. 17B is a top-down view of the exemplary structure of FIG. 17A. The vertical plane A-A' is the plane of the schematic vertical cross-sectional view of FIG. 17A.
Figure 17C:
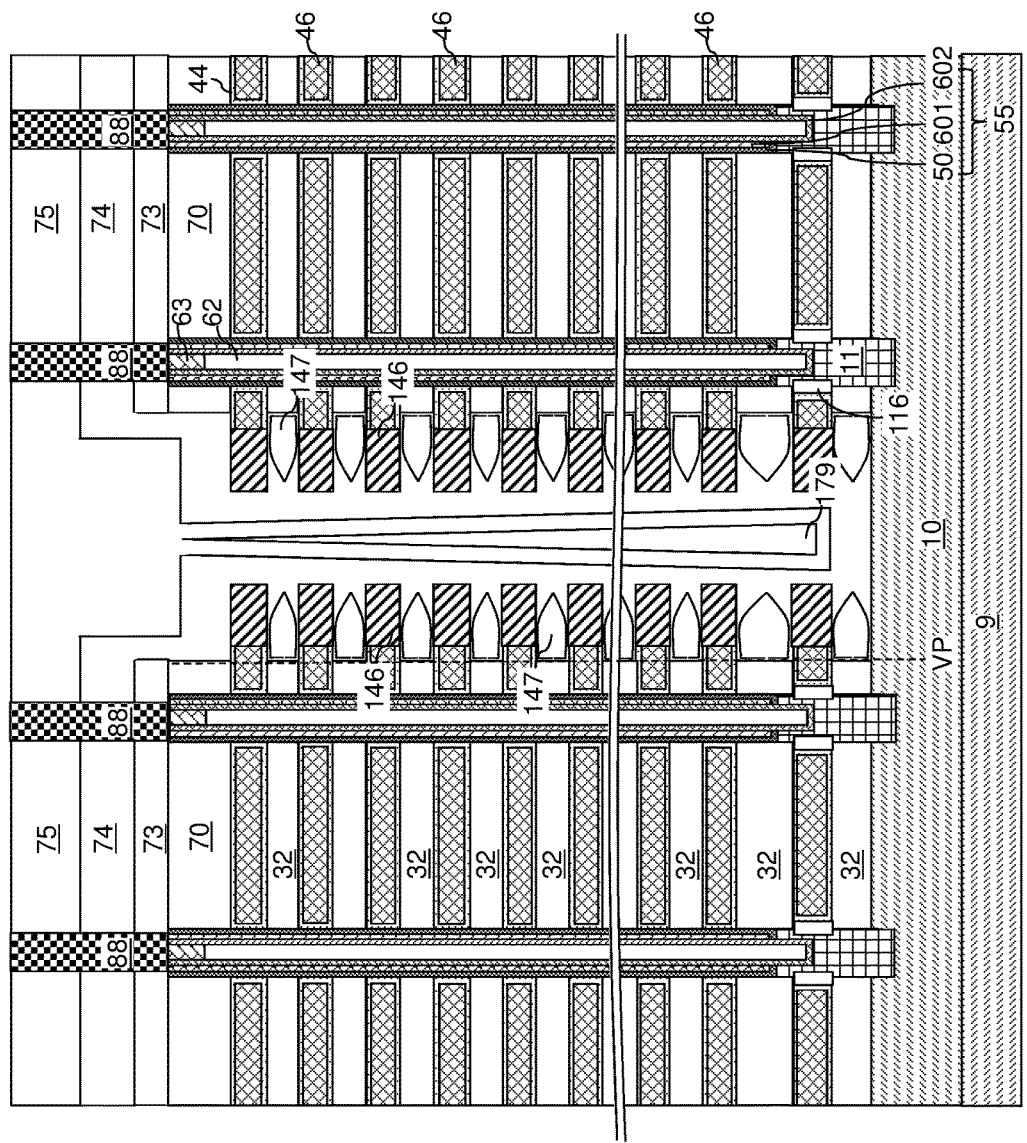
FIG. 17C is a vertical cross-sectional view of the exemplary structure along the vertical plane C-C' of FIG. 17B.

Referring to FIGS. 17A-17C, various contact via structures (88, 86, 8P) can be formed through horizontal portions of various dielectric layers (73, 74, 75) that overlie the alternating stack (32, 46) or the retro-stepped dielectric material portion 65. For example, drain contact via structures 88 can be formed through the conformal dielectric fill material layer 75, the continuous insulating material layer 74, and the contact level dielectric layer 73 on each drain region 63. Word line contact via structures 86 can be formed on the electrically conductive layers 46 through the conformal dielectric fill material layer 75, the continuous insulating material layer 74, and the contact level dielectric layer 73, and through the retro-stepped dielectric material portion 65. Peripheral device contact via structures 8P can be formed through the conformal dielectric fill material layer 75, the continuous insulating material layer 74, and the contact level dielectric layer 73, and through the retro-stepped dielectric material portion 65 directly on respective nodes of the peripheral devices.

Figure 18:
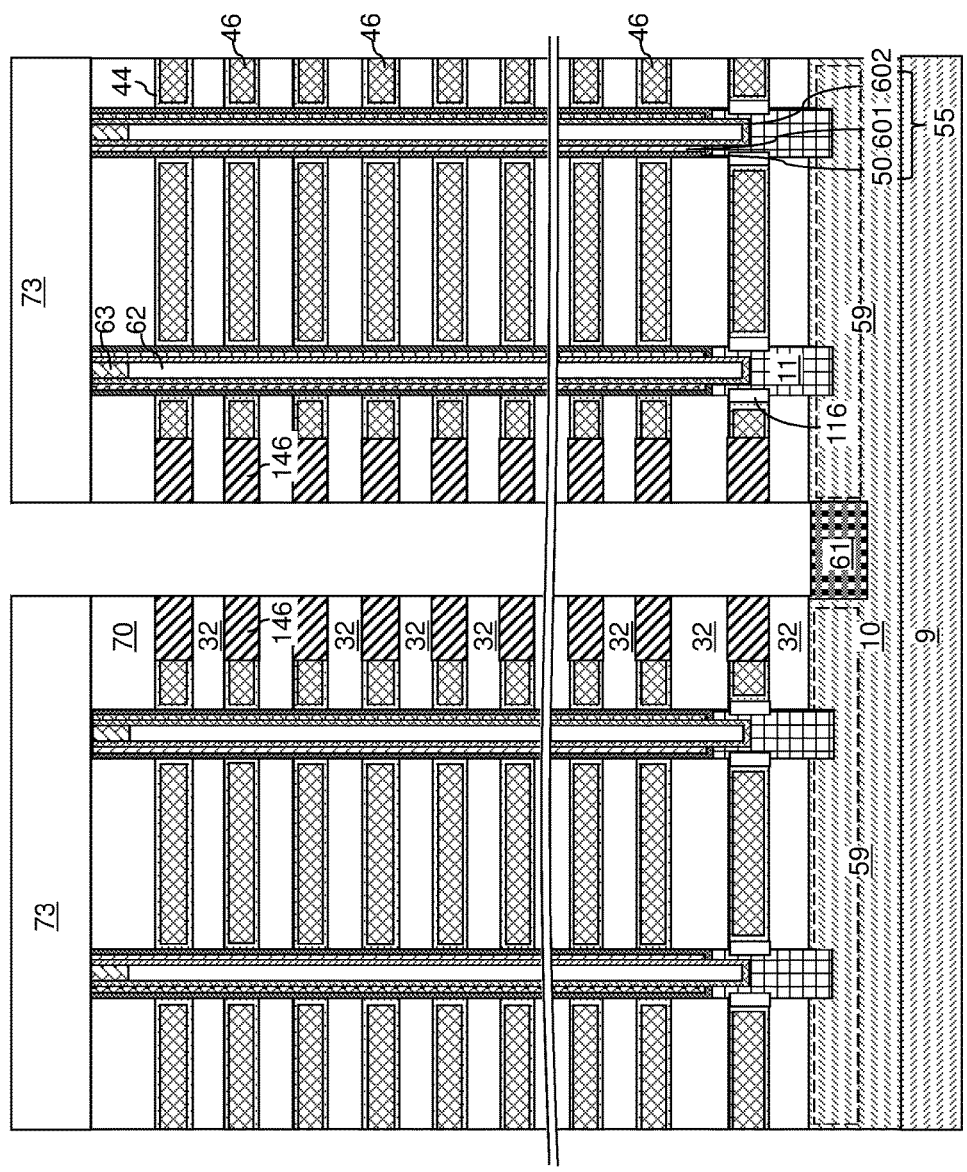
FIG. 18 is a schematic vertical cross-sectional view of an alternative embodiment of the exemplary structure after formation of a source region underneath each backside trench according to an embodiment of the present disclosure.

Referring to FIG. 18, an alternative embodiment of the exemplary structure is illustrated, which can be derived from the exemplary structure of FIG. 13 by implanting dopants of the second conductivity type (i.e., the conductivity type that is the opposite of the first conductivity type) into surface portions of the semiconductor material layer 10 that underlie the backside trenches 79. A source region 61 can be formed at a surface portion of the semiconductor material layer 10 under each backside trench 79 by implantation of electrical dopants into physically exposed surface portions of the semiconductor material layer 10.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. At least one bottommost and topmost electrically conductive layers 46 provided upon formation of the electrically conductive layers 46 within the alternating stack (32, 46) can comprise select gate electrode (e.g., source and drain side select gate electrode, respectively) for the select transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

Figure 19:
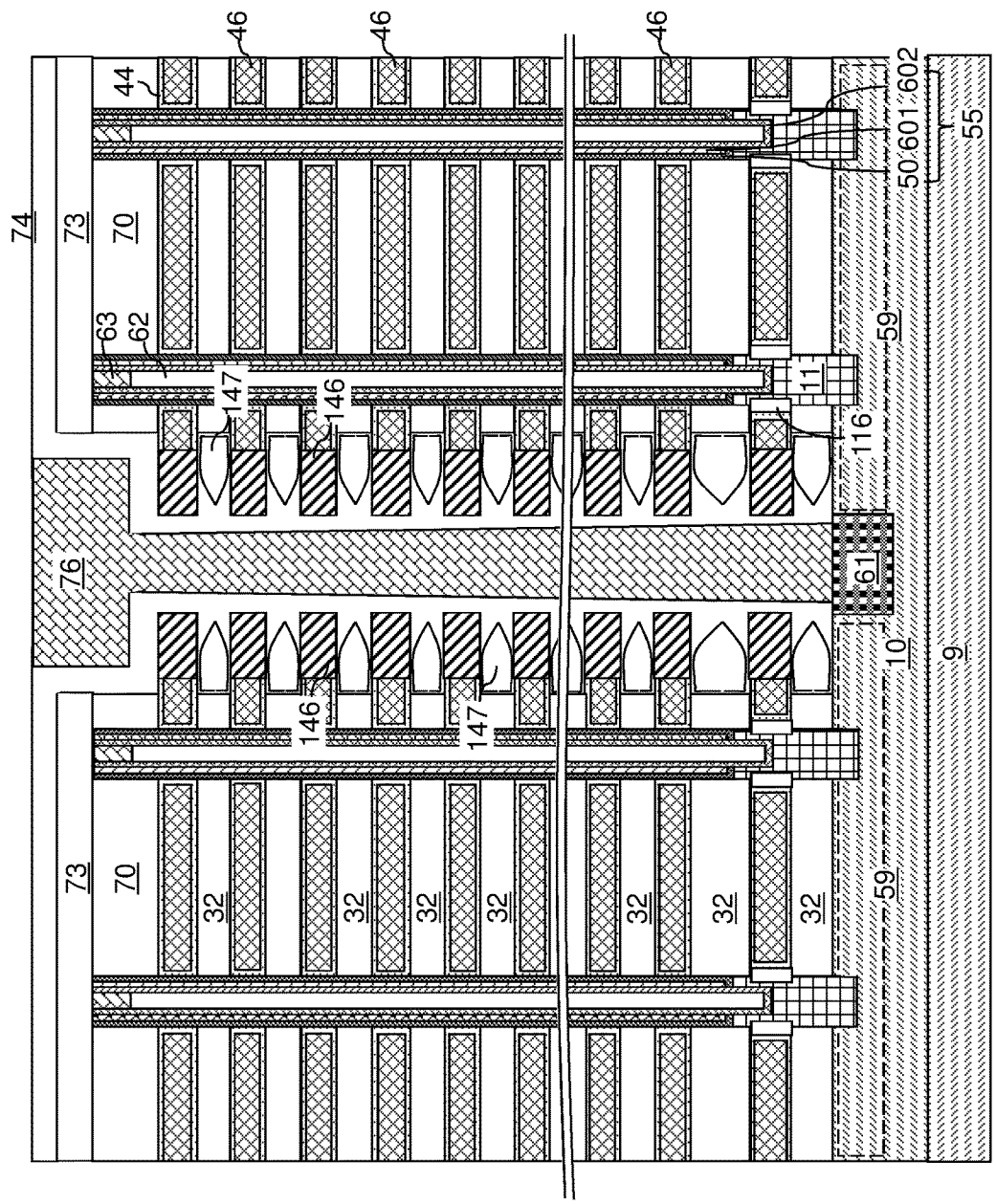
FIG. 19 is a schematic vertical cross-sectional view of the alternative embodiment of the exemplary structure after formation of a source contact via structure on each source region according to an embodiment of the present disclosure.

Referring to FIG. 19, the processing steps of FIGS. 14 and 15 can be subsequently performed to form a continuous insulating material layer 74 and air gap rails 147. The continuous insulating material layer 74 and air gap rails 147 can have the same structural features as described above. A backside cavity 79' is present within each backside trench 79.

An anisotropic etch can be performed to remove bottom horizontal portions of the continuous insulating material layer 74 at the bottom portion of each backside trench 79. A top surface of the source regions 61 can be physically exposed at the bottom of each backside trench 79. Additional horizontal portions of the continuous insulating material layer 74 overlying the alternating stack (32, 46) may be collaterally thinned by the anisotropic etch.

Alternatively, a patterning film can be anisotropically deposited such that the patterning film has a greater thickness over the alternating stack (32, 46) than at the bottom portions of the backside trenches 79. After suitable trimming of the patterning film, the anisotropic etch can be performed to remove the bottom portions of the continuous insulating material layer 74 at the bottom of each backside trench 79 while remaining portions of the patterning film protects the horizontal portions of the continuous insulating material layer 74 overlying the alternating stack (32, 46).

At least one conductive material can be deposited in the backside cavities 79' and directly on the physically exposed top surfaces of the source regions 61. The at least one conductive material can be deposited by a conformal deposition process such as chemical vapor deposition or atomic layer deposition. The at least one conductive material can include a doped semiconductor material (such as doped polysilicon) and/or at least one metallic material. In one embodiment, the at least one conductive material can include a layer stack of a conductive metal nitride liner and a metal layer consisting essentially of a single elemental metal or an intermetallic alloy of at least two elemental metals. For example, a combination of a TiN liner and a tungsten layer can be employed as the at least one metallic material. Excess portions of the at least one metallic material can be removed from above the topmost surface of the dielectric material layers (such as the top surface of the continuous insulating material layer 74) by a planarization process.

Each remaining portion of the at least one conductive material constitutes a backside contact via structure 76. Each backside contact via structure 76 is formed within a respective one of the backside cavities 79'.

The conductive liner can include a conductive metallic liner such as TiN, TaN, WN, TiC, TaC, WC, an alloy thereof, or a stack thereof. The thickness of the conductive liner can be in a range from 3 nm to 30 nm, although lesser and greater thicknesses can also be employed. The conductive fill material portion can include a metal or a metallic alloy. For example, the conductive fill material portion can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a source contact via structure 76.

Each source contact via structure 76 extends through the alternating stack (32, 46), and contacts a top surface of the source region 61. Each source contact via structure 76 is formed a remaining portion of the continuous insulating material layer 74, and is located within a respective one of the backside trenches 79.

According to various embodiments of the present disclosure, a three-dimensional memory device is provided, which comprises: an alternating stack of insulating layers 32 and electrically conductive layers located 46 over a substrate (9, 10); memory stack structures 55 extending through the alternating stack (32, 46), wherein each of the memory stack structures 55 comprises respective charge storage elements (as embodied, for example, as portions of the charge storage layer 54) and a vertical semiconductor channel 60 laterally surrounded by the respective charge storage elements; electrically conductive rails 146 contacting a sidewall of a respective one of the electrically conductive layers 46 and laterally extending along a horizontal direction; and a continuous insulating material layer 74 including a vertical portion extending vertically from a bottommost one of the electrically conductive rails 146 to a topmost one of the electrically conductive rails 146 and laterally protruding portions that laterally protrude between each vertically neighboring pair of the electrically conductive rails 146, wherein the laterally protruding portions include air gap rails 147.

The continuous insulating material layer 74 is located in a backside trench 79. As shown in FIG. 15, each air gap rail 147 includes a laterally extending cavity having a first height (h1) more proximal to the backside trench 79 and a second height (h2) greater than the first height more distal from the backside trench 79 (and more proximal to the memory stack structures 55).

In some embodiments, vertical interfaces between the laterally protruding portions of the continuous insulating material layer 74 and the insulating layers 32 can be within a same vertical plane, which can be the vertical plane including a set of recessed sidewalls of the insulating layers 32 at the processing steps of FIG. 14.

In some embodiments, the vertical portion of the continuous insulating material layer 74 can have a variable lateral width that increases with a distance from the substrate (9, 10). In some embodiments, the vertical portion of the continuous insulating material layer 74 can include a dielectric material having a lower dielectric constant than the insulating layers 32.

In some embodiments, the three-dimensional memory device can further comprise backside blocking dielectric layers 44 that are located between each vertically neighboring pair of an insulating layer 32 and an electrically conductive layer 46. In some embodiments, each of the electrically conductive rails 146 contacts a respective one of the backside blocking dielectric layers 44, has a top surface within a horizontal plane including a topmost surface of the respective one of the backside blocking dielectric layers 44, and a bottom surface that is within a horizontal plane including a bottommost surface of the respective one of the backside blocking dielectric layer 44. In this case, the thickness of each electrically conductive rail 146 can be greater than the thickness of the electrically conductive layer 46 at the same level by twice the thickness of a backside blocking dielectric layer 44.

In some embodiments, for each of the electrically conductive rails 146, a height of an interface between an electrically conductive rail 146 and a respective one of the electrically conductive layers 46 can be less than a vertical thickness of the electrically conductive rail 146 by twice a thickness of the backside blocking dielectric layers 44. In some embodiments, the laterally protruding portions of the continuous insulating material layer 74 contact horizontal surfaces of the backside blocking dielectric layers 44.

In some embodiments, the electrically conductive rails 146 have a different material composition than the electrically conductive layers 46. In some embodiment, the continuous insulating material layer 74 includes a vertically-extending cavity 179 that vertically extends through at least one half of all electrically conductive layers 46 within the alternating stack and is laterally spaced from the air gap rails 147. In some embodiments, the three-dimensional memory device further comprises a source region 61 located within the substrate (9, 10), and a source contact via structure 76 that is laterally surrounded by the vertical portion of the continuous insulating material layer 74. In some embodiments, the continuous insulating material layer 74 completely fills the backside trench 79.

In some embodiments, the alternating stack comprises a terrace region in which each electrically conductive layer 46 other than a topmost electrically conductive layer within the alternating stack (32, 46) laterally extends farther than an overlying electrically conductive layer within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 can extend through the stepped surfaces and through a retro-stepped dielectric material portion 65 that overlies the stepped surfaces.

In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

The inventors of the present disclosure recognized that reduction of the width of backside trenches adversely impacts uniformity of a wet etch process that removes the sacrificial material layers 42 selective to the insulating layers 32. Thus, reduction of the width of the backside trenches has a limit. In other words, a minimum area relative to the size of a three-dimensional memory chip is employed as areas for forming backside trenches. The various embodiments of the present disclosure utilize areas of backside trenches to provide high conductivity electrically conductive paths for word lines. Thus, each word line includes an electrically conductive layer 46 and one or two electrically conducive rails 146. Further, air gap rails 147 are provided between each vertically neighboring pair of electrically conductive rails 146, thereby reducing capacitive coupling between vertically neighboring pairs of electrically conductive rails 146. The combination of the electrically conductive rails 146 and the air gap rails 147 reduces the resistance of the word lines and the capacitive coupling among the word lines. Thus, the word lines can have reduced RC delays.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate;
memory stack structures extending through the alternating stack, wherein each of the memory stack structures comprises respective charge storage elements and a vertical semiconductor channel laterally surrounded by the respective charge storage elements;
electrically conductive rails contacting a sidewall of a respective one of the electrically conductive layers and laterally extending along a horizontal direction; and
a continuous insulating material layer including a vertical portion extending vertically from a bottommost one of the electrically conductive rails to a topmost one of the electrically conductive rails and laterally protruding portions that laterally protrude between each vertically neighboring pair of the electrically conductive rails, wherein the laterally protruding portions include air gap rails.

2. The three-dimensional memory device of claim 1, wherein:
the continuous insulating material layer is located in a backside trench; and
each air gap rail includes a laterally extending cavity having a first height more proximal to the backside trench and a second height greater than the first height more distal from the backside trench.

3. The three-dimensional memory device of claim 2, wherein the continuous insulating material layer completely fills the backside trench.

4. The three-dimensional memory device of claim 1, wherein:
vertical interfaces between the laterally protruding portions of the continuous insulating material layer and the insulating layers are within a same vertical plane; and
the vertical portion of the continuous insulating material layer has a variable lateral width that increases with a distance from the substrate.

5. The three-dimensional memory device of claim 1, further comprising backside blocking dielectric layers that are located between each vertically neighboring pair of an insulating layer and an electrically conductive layer.

6. The three-dimensional memory device of claim 5, wherein each of the electrically conductive rails contacts a respective one of the backside blocking dielectric layers, has a top surface within a horizontal plane including a topmost surface of the respective one of the backside blocking dielectric layers, and a bottom surface that is within a horizontal plane including a bottommost surface of the respective one of the backside blocking dielectric layer.

7. The three-dimensional memory device of claim 5, wherein, for each of the electrically conductive rails, a height of an interface between an electrically conductive rail and a respective one of the electrically conductive layers is less than a vertical thickness of the electrically conductive rail by twice a thickness of the backside blocking dielectric layers.

8. The three-dimensional memory device of claim 5, wherein the laterally protruding portions of the continuous insulating material layer contact horizontal surfaces of the backside blocking dielectric layers.

9. The three-dimensional memory device of claim 1, wherein the electrically conductive rails have a different material composition than the electrically conductive layers.

10. The three-dimensional memory device of claim 1, wherein the continuous insulating material layer includes a vertically-extending cavity that vertically extends through at least one half of all electrically conductive layers within the alternating stack and is laterally spaced from each of the air gap rails.

11. The three-dimensional memory device of claim 1, further comprising:
a source region located within the substrate; and
a source contact via structure that is laterally surrounded by the vertical portion of the continuous insulating material layer.

12. The three-dimensional memory device of claim 1, wherein:
the three-dimensional memory device comprises a monolithic three-dimensional NAND memory device;
the electrically conductive layers comprise, or are electrically connected to, a respective word line of the monolithic three-dimensional NAND memory device;
the substrate comprises a silicon substrate;
the monolithic three-dimensional NAND memory device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

* * * * *